United States Patent

Iwasa et al.

[11] Patent Number: 5,978,403
[45] Date of Patent: Nov. 2, 1999

[54] TWO-DIMENSIONAL DEVICE ARRAY, TWO-DIMENSIONAL SURFACE LIGHT EMITTING LASER ARRAY AND IMAGE FORMING APPARATUS

[75] Inventors: Izumi Iwasa; Hideaki Ashikaga; Yasuji Seko, all of Nakai-machi, Japan

[73] Assignee: Fuji Xerox Co., Ltd., Tokyo, Japan

[21] Appl. No.: 08/939,880

[22] Filed: Sep. 29, 1997

[30] Foreign Application Priority Data

Sep. 27, 1996 [JP] Japan .................................... 8-277165

[51] Int. Cl.$^6$ ........................................................ H01S 3/10
[52] U.S. Cl. .............................................. 372/50; 372/109
[58] Field of Search ................................ 372/50, 38, 109, 372/36

[56] References Cited

U.S. PATENT DOCUMENTS

| | | | |
|---|---|---|---|
| 5,031,118 | 7/1991 | Orenstein et al. | 372/50 |
| 5,325,386 | 6/1994 | Jewell et al. | 372/50 |
| 5,848,087 | 12/1998 | Iwasa et al. | 372/50 |
| 5,907,572 | 5/1999 | Yamamoto et al. | 372/50 |

OTHER PUBLICATIONS

Electronics Letters vol. 27, 1991, pp. 437–438. (no month).
Photonics Technology Letters vol. 8, 1994, pp. 913–917. (no month).

Primary Examiner—James W. Davie
Attorney, Agent, or Firm—Oliff & Berridge, PLC

[57] ABSTRACT

Laser elements are arranged in two dimensions in an elongated region which is longer in the horizontal direction than in the vertical direction, wherein n laser elements are arranged in the horizontal direction, while m laser elements in the vertical direction, where n>m. The anode wiring extends to a direction which is inclined to the horizontal direction and the cathode wiring extends to another direction inclined to the horizontal direction, thereby the anode wiring and the cathode wiring crossing with each other. The anodes of m laser elements in maximum arranged in the direction of the anode wiring are connected to an anode wire, while the cathodes of m laser elements in maximum arranged in the cathode wiring are connected to a cathode wire. Accordingly, even if the array is longer in the horizontal direction and a large number of laser elements are aligned in the horizontal direction, the wiring resistance and electrostatic capacitance of each wire forming the oblique matrix wiring can be small and the operation delay of the laser element can also be small.

21 Claims, 27 Drawing Sheets

IN THE CASE WHERE m=8:

| | POWER CONSUMPTION WHEN n=20 | | POWER CONSUMPTION WHEN n=200 | |
|---|---|---|---|---|
| | LIGHTING OF ONE LASER | LIGHTING OF m-LASERS | LIGHTING OF ONE LASER | LIGHTING OF m-LASERS |
| OBLIQUE MATRIX WIRING OF THE PRESENT INVENTION | 2.56mW | 0.8mW | 25.6mW | 8mW |
| CONVENTIONAL VERTICAL AND HORIZONTAL WIRING | 4.48mW | 1.76mw | 332.8mW | 161.6mW |
| 4-SECTION MATRIX WIRING | 2.24mW | 0.96mW | 166.4mW | 81.6mW |

FIG.10

TWO-DIMENSIONAL DEVICE ARRAY, TWO-DIMENSIONAL SURFACE LIGHT EMITTING LASER ARRAY AND IMAGE FORMING APPARATUS

BACKGROUND OF THE INVENTION

1. Field of the Invention

The present invention relates to a two-dimensional device array in which many active or passive devices such as light emitting devices and displaying devices are arranged in two dimensions, to a two-dimensional surface light emitting laser array in which many laser elements are arranged in two dimensions on a semiconductor substrate, to a method for driving such a two-dimensional device array and such a two-dimensional surface light emitting laser array, and to an image forming apparatus utilizing such a two-dimensional surface light emitting laser array as a light source for exposing process.

2. Description of the Related Art

A two-dimensional device array has been developed as an apparatus for emitting light, displaying an image and detecting a position within the predetermined surface by arranging in two dimensions a large number of active or passive devices such as light emitting devices and displaying devices, and this two-dimensional device array has now been put into the practical use.

However, in the case of individually driving the devices of such a two-dimensional device array, a number of wirings as many as the number of devices are required, resulting in a problem that the number of wirings increases in proportion to the number of devices.

For example, in the case of the two-dimensional surface light emitting device array having n×m devices arranged two-dimensionally with n devices in the row direction and m devices in the column direction to emit light when a voltage higher than the predetermined threshold voltage is applied across the anodes and cathodes of the devices, n×m wirings are required for the anodes in order to individually drive the devices although the cathodes can be integrally formed as a common electrode and grounded.

In view of reducing the number of wirings, it is known that many devices can be connected to the wirings in the vertical and horizontal directions by the matrix wiring method. For example, it is indicated in the Electronics Letters Vol. 27, 1991, pp. 437–438, U.S. Pat. No. 5,031,187 and Photonics Technology Letters Vol. 8, 1994, pp. 913–917 that many lasers are matrix-wired in the vertical and horizontal directions in a two-dimensional surface light emitting laser array in which many laser elements are arranged two-dimensionally on a semiconductor substrate.

FIG. 27 shows an example of the vertical and horizontal matrix wiring of the related art for a two-dimensional surface light emitting laser array in which laser elements 1 are arranged in two dimensions, namely n laser elements are arranged in the row direction while m laser elements in the column direction, the anodes of m laser elements arranged in the column direction are connected to an anode wiring 2 forming the column wirings, the cathodes of n laser elements in the row direction are connected to a cathode wiring 3 forming the row wirings, an anode pad 4 is formed at an end of the anode wiring 2, and a cathode pad 5 is formed at an end of the cathode wiring 3.

In practise, the anode wiring 2 and the anodes of m laser elements arranged in the column direction are integrally formed and the cathode wiring 3 and the cathodes of n laser elements arranged in the row direction are also integrally formed. In the example of FIG. 27, it is also possible that the row wiring is used as the anode wiring and the column wiring as the cathode wiring.

When a voltage higher than the predetermined threshold voltage is applied across one of the n column wirings, and one of the m row wirings in the two-dimensional surface light emitting laser array of the vertical and horizontal matrix wiring, a laser located at the intersecting point of these selected wirings emits light. All the laser elements in the array can be addressed sequentially to make surface light emission by driving the array with the predetermined scanning pattern. According to the vertical and horizontal matrix wiring, the number of wirings for the two-dimensional surface light emitting laser array is reduced to (m+n) from n×m wirings for the individually addressed array.

However, in the two-dimensional surface light emitting laser array of the vertical and horizontal matrix wiring as shown in FIG. 27, electrical resistance exists in the row and column wirings. There also exist various kinds of electrostatic capacitances exist, for example, the laser 1 has an electrostatic capacitance in itself and a stray capacitance is present at the intersecting points of the row and column wirings. When the array becomes large in size, namely when the wirings become longer and the number of devices connected to one wire increases, the wiring resistance and electrostatic capacitance become larger.

Therefore, when the two-dimensional surface light emitting laser array of the vertical and horizontal matrix wiring as shown in FIG. 27 is made large in the row direction direction and thereby the number of the devices n in the row direction is increased, it becomes difficult to drive the array at a high speed and at a low power, because the drive pulse is delayed due to the wiring resistance and electrostatic capacitance and because unwanted charging or discharging current flows into the wiring resistance and electrostatic capacitance to cause unwanted power consumption and heat generation.

Moreover, in the two-dimensional surface light emitting laser array of the vertical and horizontal matrix wiring as shown in FIG. 27, the number of laser elements which may be driven simultaneously is limited to n laser elements connected to one row wiring or m laser elements connected to one column wiring.

Therefore, when the n or m laser elements are driven simultaneously to drive the array at a high speed, and when the array is increased in size in the row or column direction to increase the number of devices n or m in the row or column direction, considerable heat is generated in the row or column wiring which is connected to the n or m laser elements driven simultaneously and thereby the laser characteristics may be deteriorated. On the other hand, if the n laser elements connected to one row wiring or the m lasers connected to one column wiring are divided in parts and each part is sequentially driven to suppress generation of heat, the period required for scanning and driving all the laser elements in the array becomes longer.

One or both of the row wirings and column wirings can be divided into two sections in the two-dimensional surface light emitting laser array of the vertical and horizontal matrix wiring.

For example, the row wirings are divided into two sections and the laser array is also divided into two sections in the point of view of wiring. According to this structure, the wiring resistance and electrostatic capacitance of the row wirings can be reduced to ½ in comparison with the case where the dividing is not performed as shown in FIG. 27 and a total of 2m laser elements connected to two column wirings or a total of n laser elements connected to two row wirings may be driven simultaneously.

In this case, the total number of the row wirings and column wirings is increased to (2m+n) and the row wiringa divided into two sections may be extracted from two sides opposed to the row direction of the array.

Otherwise, both the row wirings and column wirings are divided into two sections to divide the laser array into four sections from the viewpoint of wiring. According to this structure, the wiring resistance and electrostatic capacitance of the row wirings and column wirings can be reduced to ½ in comparison with the case where dividing is not performed as shown in FIG. 27 and a total of 2m lasers connected to four column wirings or a total of 2n lasers connected to four row wirings may be driven simultaneously.

In this case, the total number of the row wirings and column wirings is increased to 2 (m+n) and these wirings may be extracted from the four sides of the array.

However, even when the row wirings or column wirings are divided into two sections, n/2 or m/2 lasers are connected to a row or column wiring, respectively, resulting in the problem that the wiring resistance and electrostatic capacitance become large in proportion to the size of array.

For example, a two-dimensional surface light emitting laser array may be used in a laser beam printer as a light source of exposing process, in which the row direction of the array is considered to correspond to the main scanning direction and the column direction to correspond to the sub-scanning direction. The array is driven with the predetermined scanning pattern based on the image data, the photosensitive material drum is irradiated with the laser beams from the array via an optical system to form an electrostatic latent image on the photosensitive material drum, and the electrostatic latent image is developed to a toner image and then transferred on a sheet of recording paper. In this case, several hundreds of laser elements are required as the number of laser elements n in the row direction of the two-dimensional surface light emitting laser array.

Therefore, even when the row wirings are divided into two sections, the wiring resistance and electrostatic capacitance of each row wiring become considerably large. As a result, when the lasers are driven electrically, the response to the drive pulse is delayed due to the large wiring resistance and electrostatic capacitance. Accordingly, it is now difficult to drive the array at a high speed, and at the same time, unwanted power consumption and generation of heat are caused by unwanted charging/discharging current flowing into the large wiring resistance and electrostatic capacitance.

When the row wirings are divided into many sections, the wiring resistance and electrostatic capacitance of each row wiring may be reduced, but in this case, the total number of the row wirings increases and thereby the advantage of the matrix wiring is lost and it is now difficult to extract the row wirings out of the array except for both end portions thereof in the row direction.

This problem may also be considered for a two-dimensional device array which executes emission of light, display of image or detection of position within a constant display surface by arranging two-dimensionally a large number of active or passive devices such as light emitting devices and displaying devices other than semiconductor lasers.

Namely, in the ordinary two-dimensional device array in which many devices arranged in two dimensions are matrix-wired in the vertical and horizontal directions (row and column directions), electrical resistance exists in the row wirings and column wirings. There also exist various electrostatic capacitances. A device has electrostatic capacitance in itself and a atray capacitance is present at the intersecting points of the row and column wirings. When the array becomes longer in one direction, namely when the number of devices connected to one wiring in one direction increases, the wiring resistance and electrostatic capacitance of the wiring in one direction increase. Thereby, when the devices are driven electrically, various disadvantages such as delay of operation in the devices, increase of power consumption, and increase of crosstalk between the devices may be caused by the large wiring resistance and electrostatic capacitance.

OBJECT AND SUMMARY OF THE INVENTION

Therefore, in the present invention, a large number of devices are arranged in two dimensions to form an array of which one side is much longer than the other side, and the devices are wired in a matrix wiring method to form a two-dimensional device array wherein the wiring resistance and electrostatic capacitance of each wiring are small and the operation delay of the devices, unnecessary power consumption and crosstalk between the devices are also small.

Moreover, in the present invention, a large number of laser elements are arranged in two dimensions on a semiconductor substrate to form an array of which one side is much longer than the other side, and the devices are wired in a matrix wiring method to form a two-dimensional surface light emitting laser array wherein the wiring resistance and electrostatic capacitance of each wiring are small and the operation delay of the lasers, unnecessary power consumption and crosstalk between the lasers are also small.

According to one aspect of the present invention, a two-dimensional device array is presented, in which
devices having at least first electrodes and second electrodes are arranged in two dimensions in an elongated region with n devices in the longer side direction and m devices in the shorter side direction (where m<n),
the first wirings with n or more in number are stretching in the first direction crossing the longer side direction and arranged in the longer side direction, each of which is connected to the first electrodes of m elements in maximum arranged in the first direction, and
the second wirings with n or more in number are stretching in the second direction crossing the longer side direction and the first direction and arranged in the longer side direction, each of which is connected to the second electrodes of m elements in maximum arranged in the second direction.

According to another aspect of the present invention, a two-dimensional surface light emitting laser array is presented, in which
surface light emitting laser elements having at least first electrodes and second electrodes are arranged in two dimensions in an elongated rectangular region on a semiconductor substrate, with n laser elements in the longer side direction and m laser elements in the shorter side direction (where m<n),
the first wirings with n or more in number are stretching in the first direction crossing the longer side direction and arranged in the longer side direction, each of which is connected to the first electrodes of m elements in maximum arranged in the first direction, and the second wirings with n or more in number are stretching in the second direction crossing the longer side direction and the first direction and arranged in the longer side direction, each of which is connected to the second electrodes of m elements in maximum arranged in the second direction.

In the first or second aspect of the present invention, the shorter side direction may be set vertical (perpendicular) to the longer side direction and the first direction may be matched with (parallel to) the shorter side direction.

Or, the shorter side direction is set vertical to the longer side direction and the first direction may be inclined to the longer side direction.

Moreover, the shorter side direction may be inclined to the longer side direction and the first direction may be matched with the shorter side direction.

In the two-dimensional device array according to the first aspect of the present invention, the first wirings are extended in the first direction which is vertical or inclined to the longer side direction of the elongated region and m devices in maximum are connected to each of the first wirings even when the number of devices n in the longer side direction of the elongated region is much larger than the number of devices m in the shorter side direction. Therefore, the wiring resistance and electrostatic capacitance of the first wirings can be small.

Moreover, the second wirings are extended in the second direction which is also inclined to the longer side direction of the elongated region and m devices in maximum are connected to each of the second wirings even when the number of devices n in the longer side direction of the elongated region is much larger than the number of devices m in the shorter side direction. Accordingly, the wiring resistance and electrostatic capacitance of the second wirings can be small.

Therefore, the operation delay of the devices, unnecessary power consumption and crosstalk between the devices can be suppressed.

The argument above can also be applied to the two-dimensional surface Light emitting laser array according to the second aspect of the present invention.

The method of matrix wiring for the two-dimensional element array and two-dimensional surface light emitting laser array according to the first and second aspect of the present invention is called the oblique matrix wiring in the following description.

BRIEF DESCRIPTION OF THE DRAWINGS

Other objects and advantages of the present invention will be apparent from the following detailed description of the presently preferred embodiments thereof, which description should be considered in conjunction with the accompanying drawings in which:

FIG. 10 is a diagram showing a result of comparison of power consumption in the methods of matrix-wiring of the present invention and of the related art.

DESCRIPTION OF THE PREFERRED EMBODIMENTS

[Embodiment as a two-dimensional surface light emitting laser array]

Figure 1:
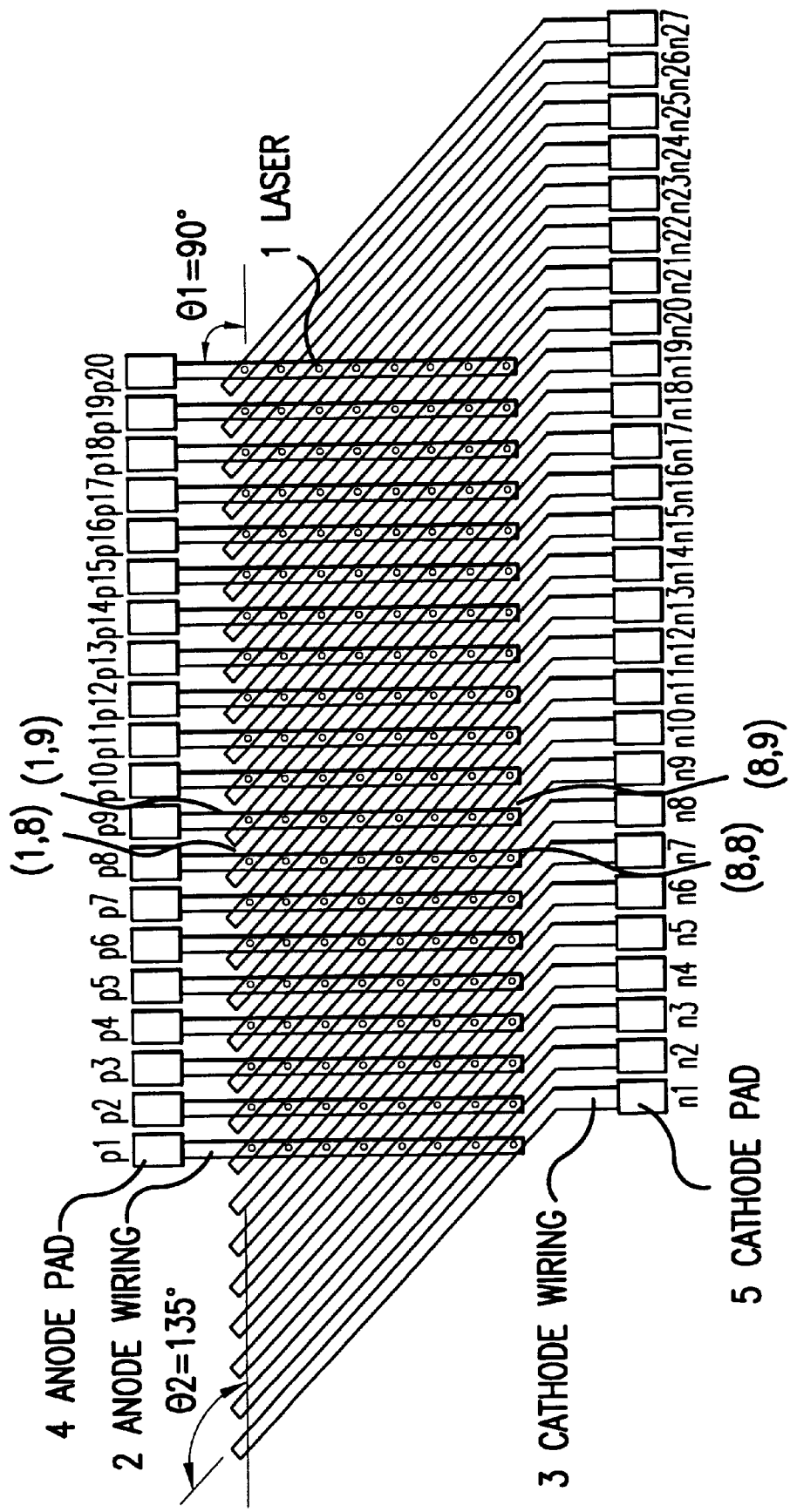
FIG. 1 is a diagram showing an example of the two-dimensional surface light emitting laser array of the present invention.

Embodiment 1 . . . FIG. 1

FIG. 1 shows an example of the two-dimensional surface light emitting laser array.

In this example, the laser elements 1 are arranged in two dimensions, namely n laser elements are arranged in the horizontal direction (row direction) and m laser elements in the vertical direction (column direction) in the elongated rectangular region on a semiconductor substrate having the longer side in the horizontal direction. In this case, n>m and m=8 and n=20 in FIG. 1. Moreover, in this example, the pitch of the laser elements 1 in the row direction is equal to the pitch in the column direction.

The anode wiring 2 extending in the column direction at an angle of θ1=90° to the row direction is arranged in n wires in the row direction as indicated by the anode wires p1 to p20 and each anode wire 2 is connected to the anodes of m laser elements arranged in the column direction.

Moreover, the cathode wiring 3 extending in the direction inclined to the row and column directions at an angle of θ2=135° to the row direction is arranged in (n+m−1) wires in the row direction as indicated by the cathode wires n1 to n27. Each of the (n−m+1) cathode wires n8 to n20 among the cathode wirings at the center in the row direction is connected to the cathodes of m laser elements arranged in the extending direction of the cathode wiring, while the (m−1) cathode wires n1 to n7 and n21 to n27 at both ends of the cathode wiring are connected to the cathodes of (m−1) to one laser elements arranged in the extending direction.

Actually, an anode wire 2 and the anodes of m laser elements arranged in the column direction may be integrated and a cathode wire 3 and the cathodes of m or less than m laser elements arranged in the extending direction of the cathode wiring may also be integrated. Moreover, an anode pad 4 is formed at one end of the anode wiring 2 in the upper side of the array and a cathode pad 5 is formed at one end of the cathode wiring 3 in the lower side of the array.

In the two-dimensional surface light emitting laser array of this embodiment, the array emits light by driving the array electrically as will be explained later.

According to this embodiment, the anode wiring 2 is extended in the column direction. Therefore, no matter how the number of elements n in the row direction is larger than the number of elements m in the column direction, the number of elements connected to one anode wire 2 is m and the wiring resistance and electrostatic capacitance of the anode wiring 2 remain small. Moreover, the cathode wiring 3 is extended in the inclined direction to the row and column directions. Therefore, no matter how the number of elements n in the row direction is larger than the number of elements m in the column direction, the maximum number of elements connected to one cathode wire 3 is m and the wiring resistance and electrostatic capacitance of the cathode wiring 3 also remain small.

Therefore, when the laser 1 is driven electrically, as will be explained later, the delay of response to the drive pulse is short and thereby the array may be driven at a higher speed. Unnecessary charging and discharging current is reduced and thereby unnecessary power consumption and heat generation may also be reduced.

Figure 27:
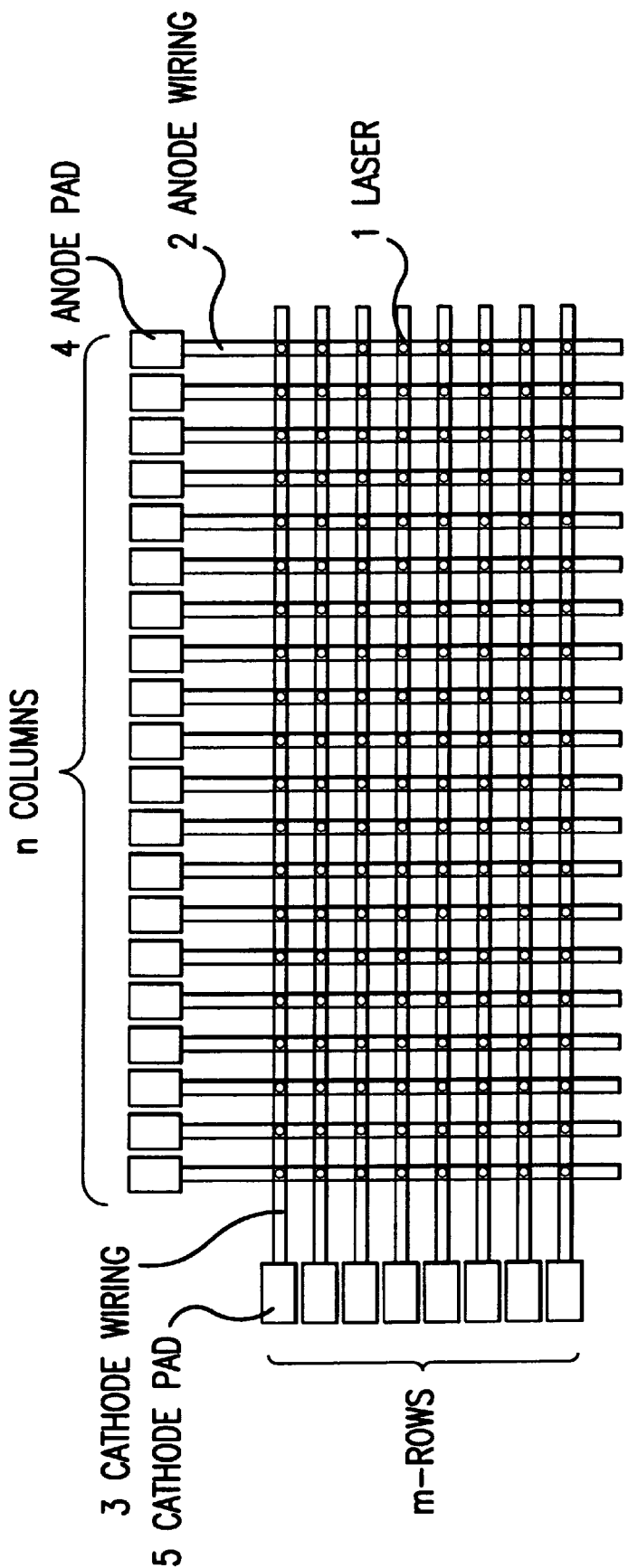
FIG. 27 is a diagram showing an example of the two-dimensional surface light emitting laser array of the related art.

In addition, the number of wirings amounts (2n+m−1) which is larger than the number of the vertical and horizontal matrix wirings shown in FIG. 27 but much smaller than the number of the independent wirings.

Moreover, since the anode wirings 2 are extracted from the array to one side of the column direction, while the cathode wirings 3 are extracted to the other side of the column direction, the interval of the anode wirings 2 and the interval of the cathode wirings 3 can be set equal to the pitch of the lasers 1 in the row direction and thereby the anode wirings 2 and cathode wirings 3 can be extracted easily.

In this case, ICs (Integrated Circuits) for driving the array are arranged adjacent to the upper and lower sides of the array and thereby the array and the driving ICs can be connected by bonding wires.

The anodes and the anode wirings can be exchanged with the cathodes and the cathode wirings, respectively, in this example as well as in other examples indicated below.

Figure 2:
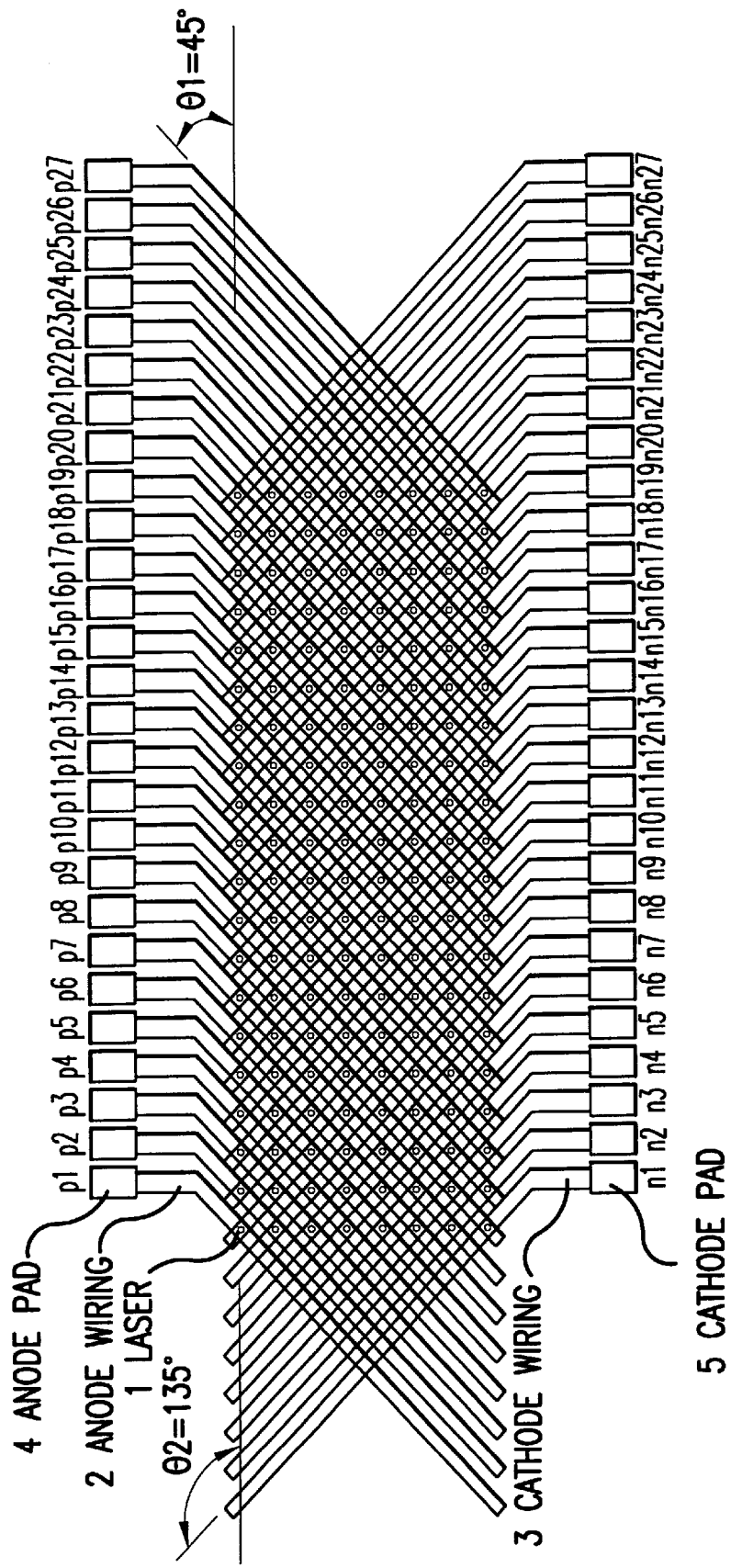
FIG. 2 is a diagonal showing another example of the two-dimensional surface light emitting laser array of the present invention.

Embodiment 2 . . . FIG. 2

FIG. 2 shows another example of the two-dimensional surface light emitting laser array of the present invention. The arrangement of the laser elements 1 and the direction of the cathode wirings 3 are the same as those in FIG. 1. The anode wirings 2 inclined to the row direction and column direction at an angle θ1=45° to the row direction is arranged in the (n+m−1) wires in the row direction as indicated by the anode wires p1 to p27. Each of the (n−m+1) anode wires p8 to p20 at the center of the wiring in the row direction is connected to the anodes of m laser elements arranged in the extending direction of the anode wiring and (m−1) anode wires p1 to p7 and p21 to p27 at both sides are connected to the anodes of (m−1) to one laser elements arranged in the extending direction.

Like the embodiment of FIG. 1, the anode pad 4 is formed as a part of the anode wiring 2 at the upper side of the array, while the cathode pad 5 is formed as a part of the cathode wiring 3 at the lower side of the array.

Therefore, the advantages in this embodiment are the same as those in the first embodiment in FIG. 1 except for the point that the number of wires amounts 2 (n+m−1) wires.

Figure 3:
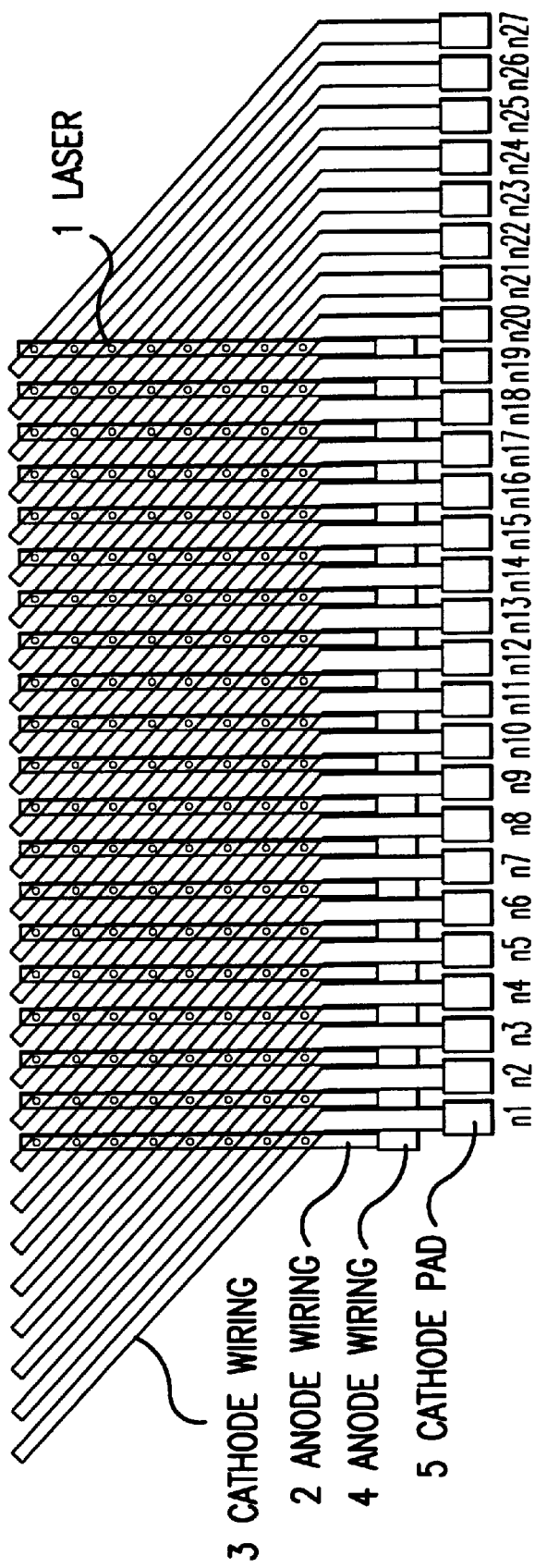
FIG. 3 is a diagram showing still another example of the two-dimensional surface light emitting laser array of the present invention.

Embodiment 3 . . . FIG. 3

FIG. 3 shows another embodiment of the two-dimensional surface light emitting laser array of the present invention. Both the anode pads 4 and the cathode pads 5 are formed on the lower side of the array.

According to this embodiment, ICs for driving the array are arranged adjacent to the lower side of the array and thereby the array and the driving ICs can be connected by bonding wires.

Figure 4:
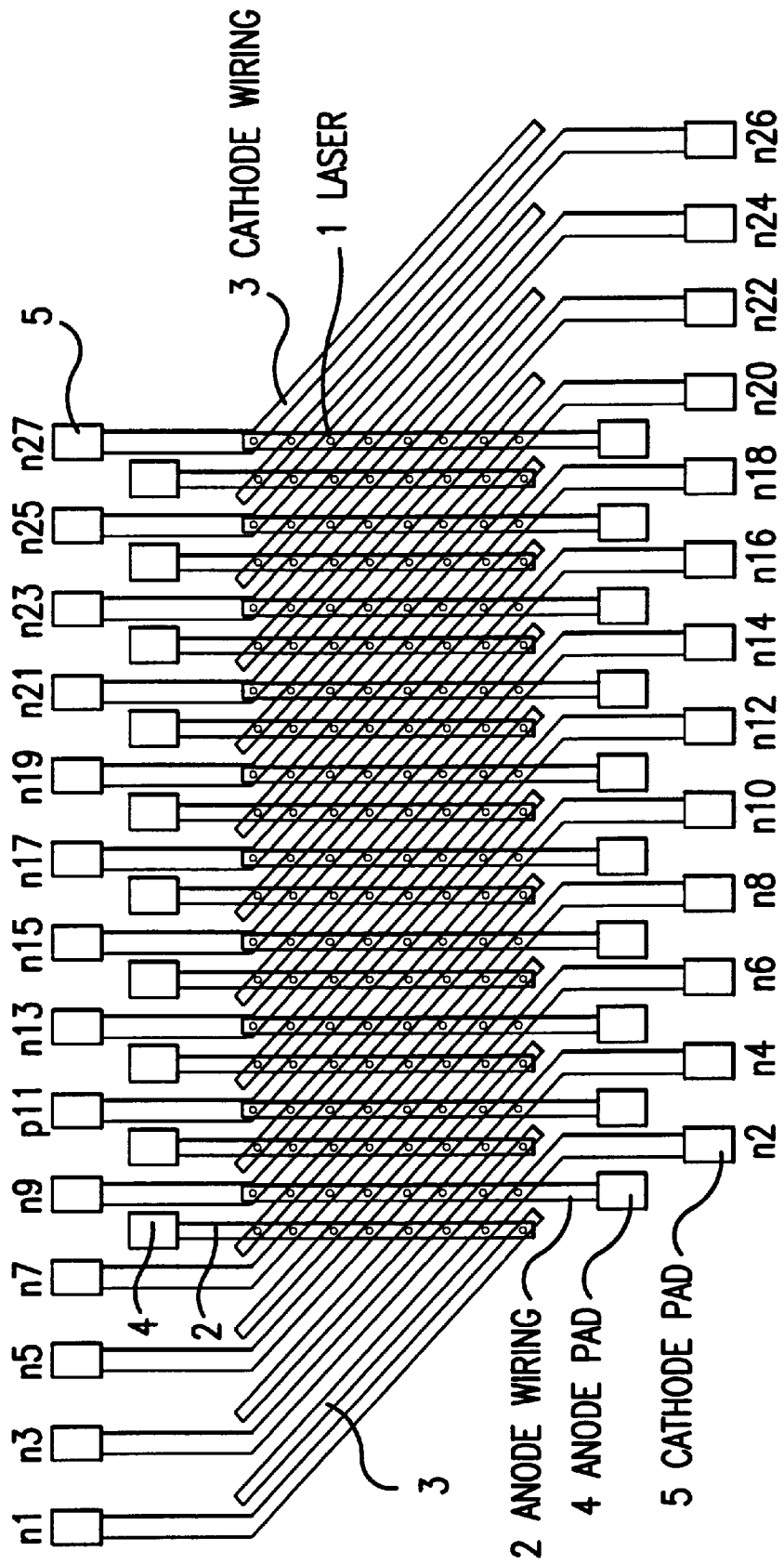
FIG. 4 is a diagram showing still another example of the two-dimensional surface light emitting laser array of the present invention.
Figure 5:
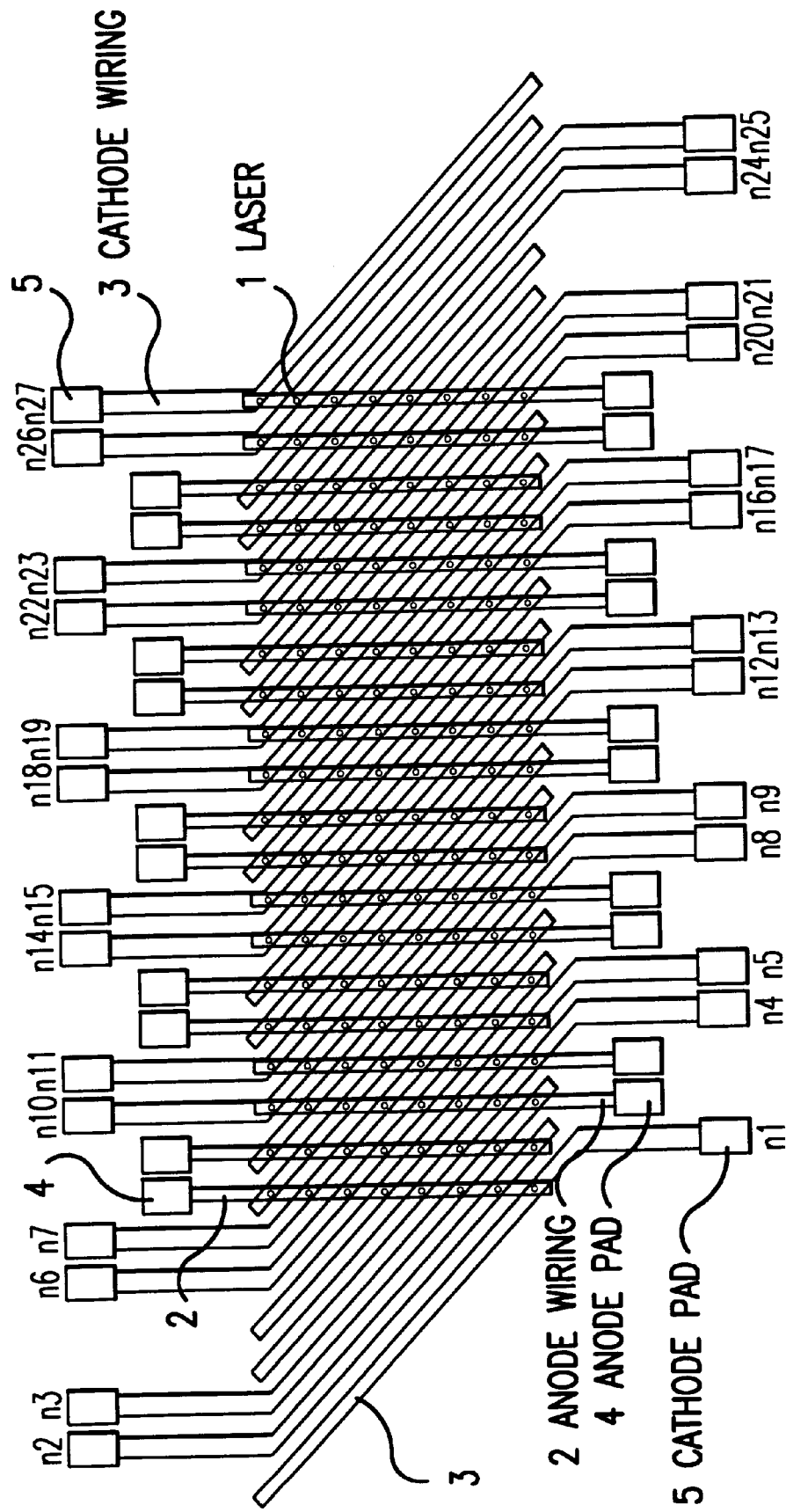
FIG. 5 is a diagram showing still another example of the two-dimensional surface light emitting laser array of the present invention.
Figure 6:
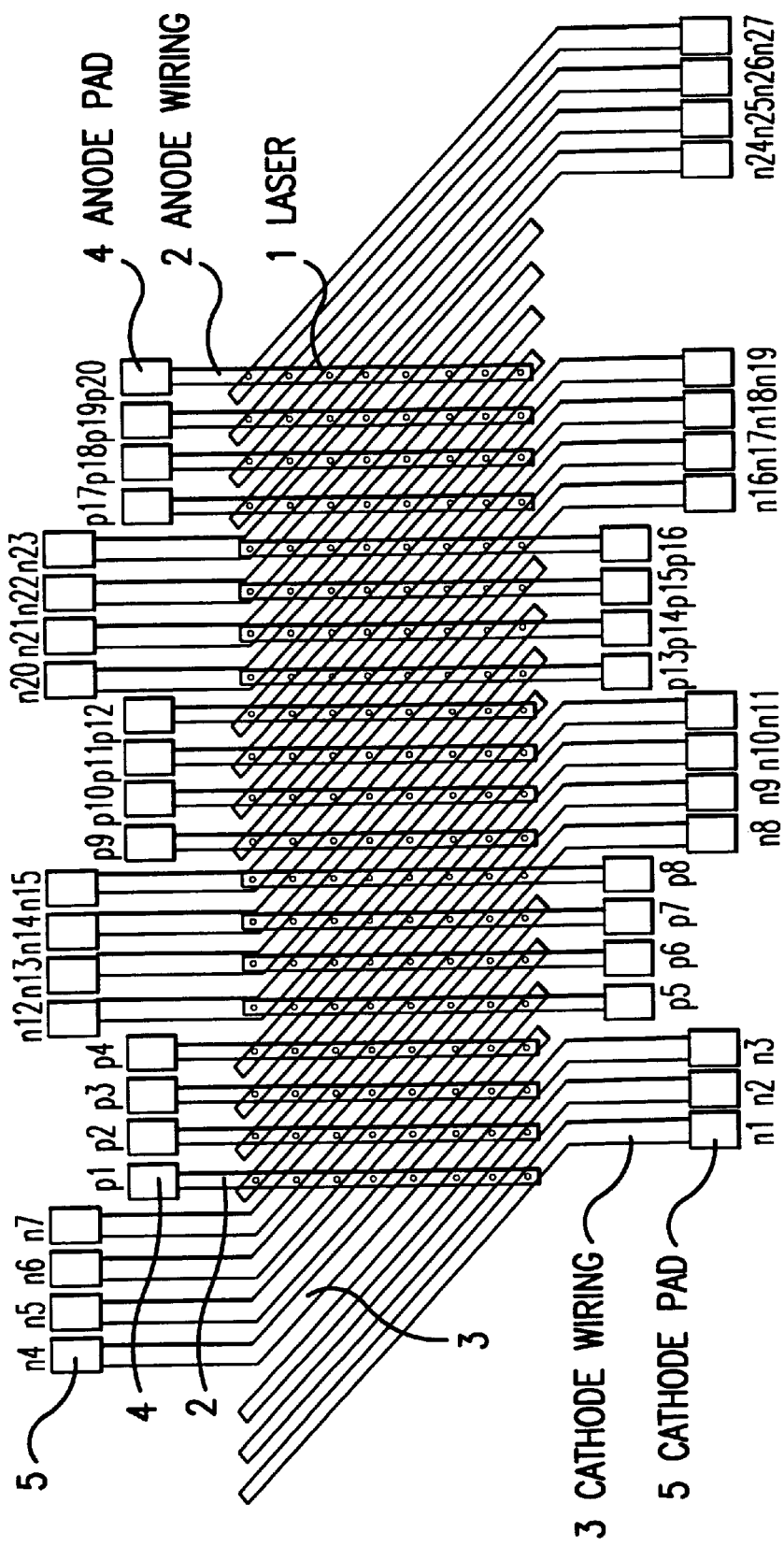
FIG. 6 is a diagram showing still another example of the two-dimensional surface light emitting laser array of the present invention.

Embodiment 4 . . . FIG. 4, FIG. 5, FIG. 6

The anode wirings 5 and cathode wirings 3 can be extracted alternately in every other or every several other wirings to the upper side and the lower side of the array.

Namely, when the number of elements m in the column direction is an even number, a divisor of m/2 is defined as p. Then every p anode wirings can be extracted alternately to the upper and lower sides of the array and every p cathode wirings can be extracted alternately to the upper and lower sides of the array, so that the interval between the anode wirings 2 and the cathode wirings 3 can be set equal to the pitch of the lasers 1 in the row direction and the anode pads 4 and cathode pads 5 can easily be formed without overlapping and with a clearance.

Moreover, when the number of elements m in the column direction is an odd number, a divisor of (m−1)/2 is defined asp. Then every p anode wirings can be extracted alternately to the upper and lower sides of the array and every p cathode wirings can be extracted alternately to the upper and lower sides of the array, so that the interval between the anode wirings 2 and the cathode wirings 3 can be set equal to the pitch of the lasers L in the row direction and the anode pads 4 and cathode pads 5 can easily be formed without overlapping and with a clearance.

For example, when m=8, m is an even number and m/2=4. Then p becomes equal to 1, 2, or 4. FIG. 4, FIG. 5 and FIG.

6 respectively show the examples for m=8 where p is set to 1, 2, and 4. In these examples, like the examples of FIG. 1 and FIG. 4, the driving ICs can be arranged adjacent to the upper and lower sides of the array and the array and the driving ICs can be connected by bonding wires.

[Driving method for two-dimensional surface light emitting laser array]

In the oblique matrix wiring of the present invention, an anode wire 2 is connected to m cathode wires via m laser elements and a cathode wire 3 is connected to m anode wires via m lasers except for the (m−1) cathode wires at both sides of the array in the embodiments of FIG. 1 to FIG. 6 and for the (m−1) anode wires at both sides of the array in the embodiment of FIG. 2.

The method for driving a two-dimensional surface light emitting laser array of the oblique matrix wiring comprises the steps of:

selecting one of the anode wires and applying a drive voltage to the selected anode wire, simultaneously applying a bias voltage to (m−1) anode wires on both sides of the selected anode wire; and sequentially or simultaneously applying another drive voltage to m of the cathode wires which are crossing the selected anode wire and connected to the cathodes of m lasers on the selected anode wire.

The steps result in a voltage difference which is above the threshold voltage for operating the lasers across all or a part of the m lasers connected to the selected anode wire, and result in another voltage difference which is below the threshold voltage across the lasers connected to the (m−1) anode wires on both sides of the selected anode wire.

When the selected anode wire is located at one end of the array and only (m−2) anode wires or less exist in the single side, a bias voltage is applied to the (m−2) or less anode wires on this side of the selected anode wire and to (m−1) anode wires on the other side of the selected anode wire.

In this driving method, another anode wire separated by (m−1) or more wires from the selected anode wire can be driven simultaneously and independently along with the selected anode wire. Hence, m laser elements in maximum may be allowed to emit light per anode wire and n/m wires can be driven simultaneously and independently, where n/m is an integer omitting the fractions after the decimal point, for example, n/m=2 when n=20, m=8 as in the case of FIG. 1 to FIG. 6. Accordingly, in the array as a whole, when n/m is an integer, m×(n/m)=n laser elements may be allowed to emit light simultaneously and thereby the period for scanning and driving the array as a whole can be shortened.

In the case of driving one laser element per one anode wire, n/m laser elements connected to n/m different another anode wires can be driven simultaneously.

In the above driving method, the roles of the anode wiring and the cathode wiring may be exchanged with each other.

Several variations of the driving method will be explained in detail for driving the two-dimensional surface light emitting laser array of FIG. 1.

Figure 7:
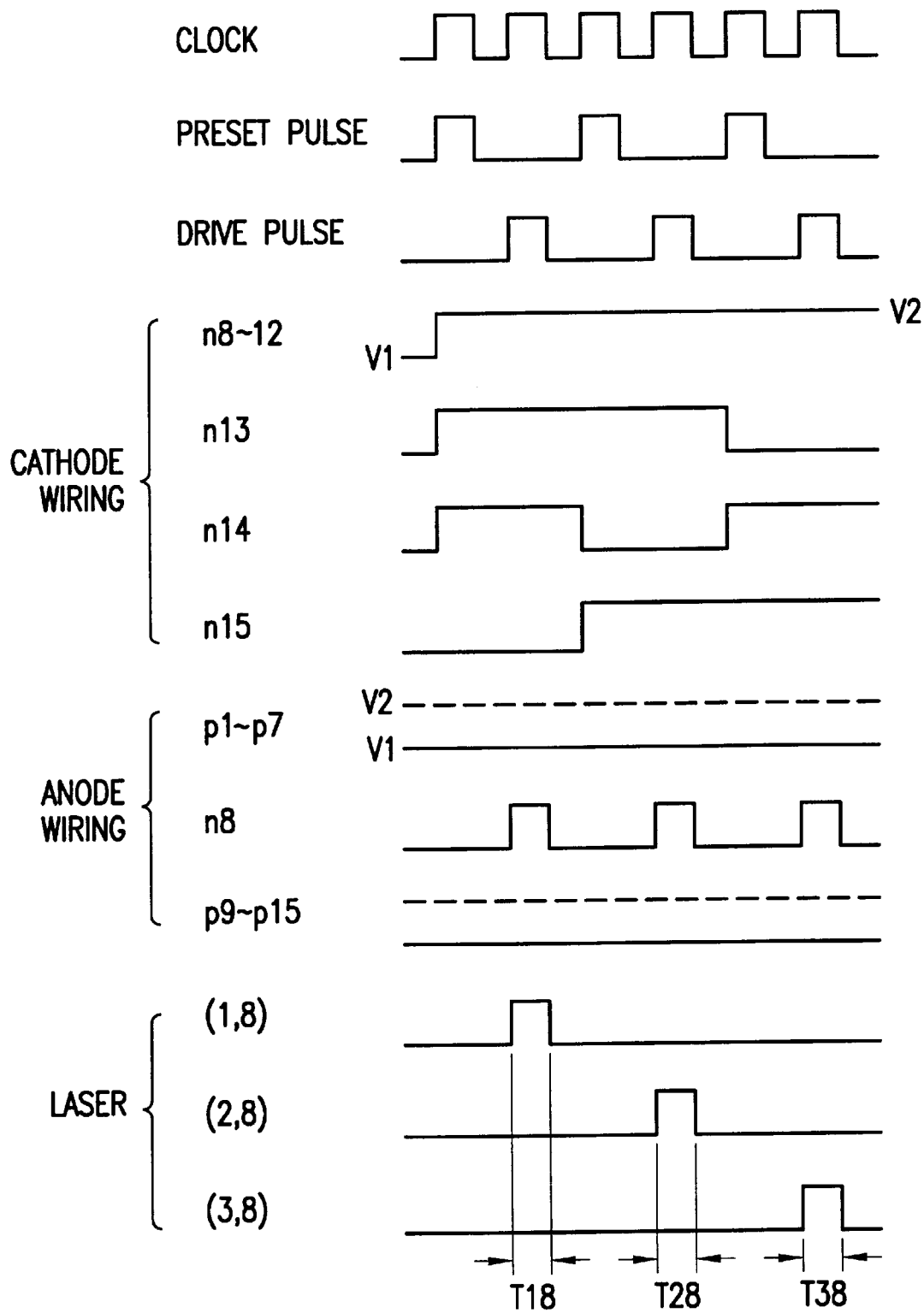
FIG. 7 is a diagram for explaining a driving method of the present invention.
Figure 8:
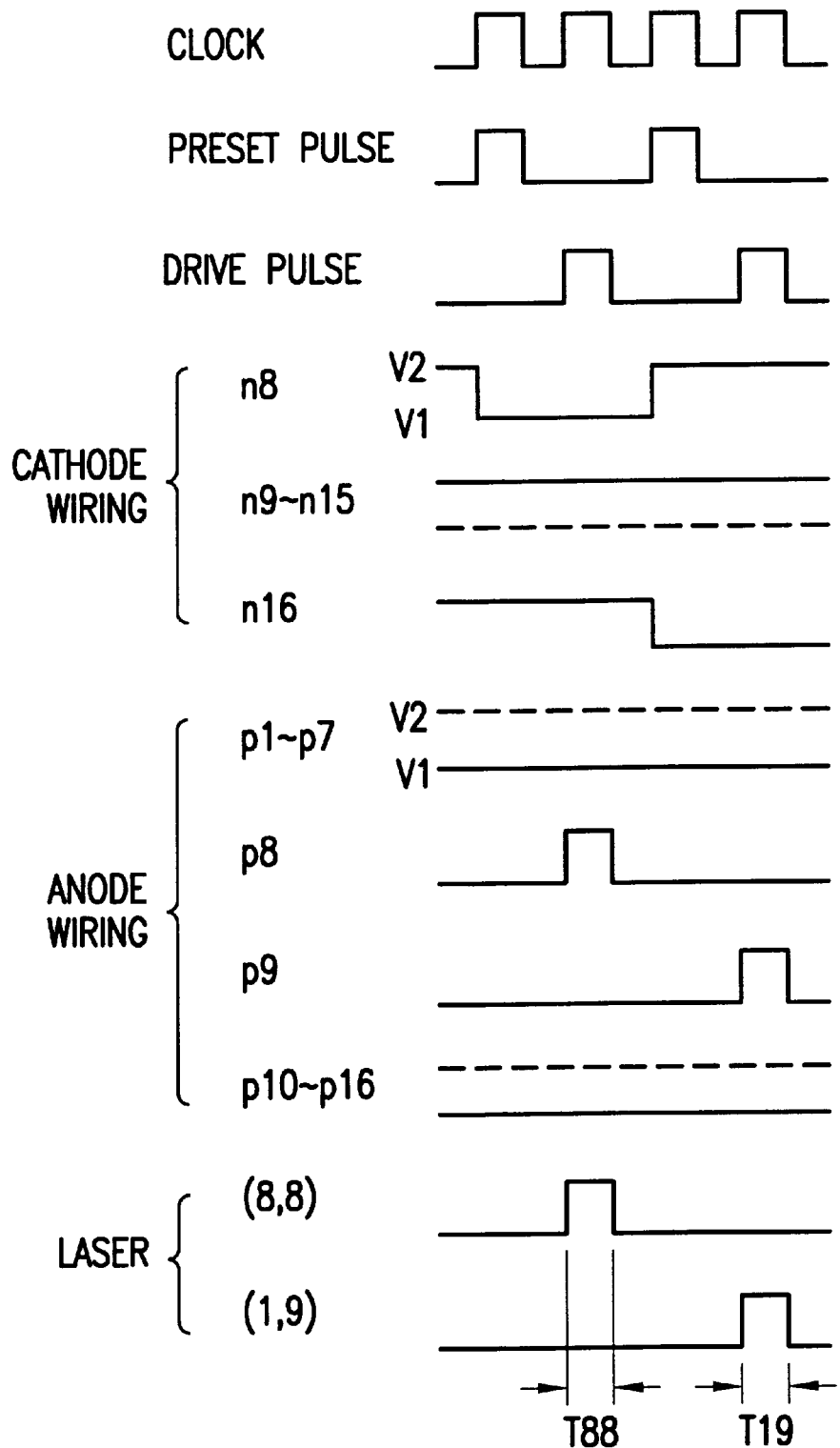
FIG. 8 is a diagram for explaining another driving method of the present invention.

First Driving Method . . . FIG. 7, FIG. 8

In the first driving method, eight laser elements connected to one anode wire are driven sequentially, namely, one by one.

As shown in FIG. 7, preset pulses and drive pulses are respectively obtained from one and another sequence of every second clock pulses. The preset pulses switch the bias voltage applied to the cathode wiring. The drive pulses switch the driving voltage applied to the anode wiring.

In order to light one by one the eight laser elements (1,8) to (8,8) connected to the anode wire p8 and the cathode wires n15 to n8, respectively, a high voltage V2 is applied to the cathode wires n8 to n14, a low voltage V1 is applied to the cathode wire n15 and a low voltage V1 is applied to the anode wire p1 to p7 and p9 to p15.

Under this condition, a drive voltage pulse of a duration T18 is applied to the anode wire p8, namely, the voltage of the anode wire p8 is initially set to the low voltage V1, then changed to the high voltage V2, and after the duration T18 changed to the initial low voltage V1. Thereby, in the duration T18, a forward voltage, V2−V1, which is higher than the threshold value voltage of laser 1, is applied solely to the laser element (1, 8) located at the intersecting point of the anode wire p8 and cathode wire n15 and the laser (1, 8) emits light.

Next, the bias voltage of the cathode wire n15 is changed to the high voltage V2 from the low voltage V1 and the bias voltage of the cathode wire n14 is changed to the low voltage V1 from the high voltage V2. Under this condition, when another drive pulse is applied to the anode wire p8 in the duration T28, the forward voltage, V2−V1, higher than the threshold value voltage of laser 1 is applied solely to the laser (2, 8) located at the intersecting point of the anode wire p8 and the cathode wire n14 and the laser (2, 8) emits light.

Subsequently, the lasers (3, 8), (4, 8), . . . located at the intersecting points of the anode wire p8 and the cathode wire n13, n12, . . . can be operated sequentially.

Under the condition that the low voltage V1 is applied to the cathode wire n8 and the high voltage V2 is applied to the cathode wire n9 to n15, the laser (8, 8) located at the intersecting point of the anode wire p8 and the cathode wire n8 emits light when the drive pulse is applied to the anode wire p8 in the duration T88 as shown in FIG. 8.

So far, the anode wires p1 to p15 and the cathode wires n8 to n15 are used to sequentially light the eight lasers (1, 8) to (8, 8) connected to the anode wire p8.

Next, the anode wires p2 to p16 and the cathode wires n9 to n16 are used to sequentially light the eight lasers elements (1, 9) to (8, 9) connected to the anode wire p9.

In this case, the high voltage V2 is applied to the cathode wires n9 to n15, the low voltage V1 is applied to the cathode wire n16 and the low voltage V1 is applied to the anode wires p2 to p8 and p10 to p16.

Under this condition, when the drive pulse is applied to the anode wire p9 in the duration T19, the forward voltage, V2−V1, higher than the threshold value voltage of laser 1 is applied solely to the laser (1, 9) located at the intersecting point of the anode wire p9 and the cathode wire n16 and the laser (1, 9) emits light.

Under this condition, when the drive pulse is applied to the anode wire p9 in the period T19, the forward voltage higher than the light emitting threshold value voltage of laser 1 is applied only to the laser elements (1, 9) at the intersecting point of the anode wire p9 and cathode wire n16 to light the laser elements (1, 9). The other lasers (2, 9) to (8, 9) are also operated in the same manner.

Figure 9:
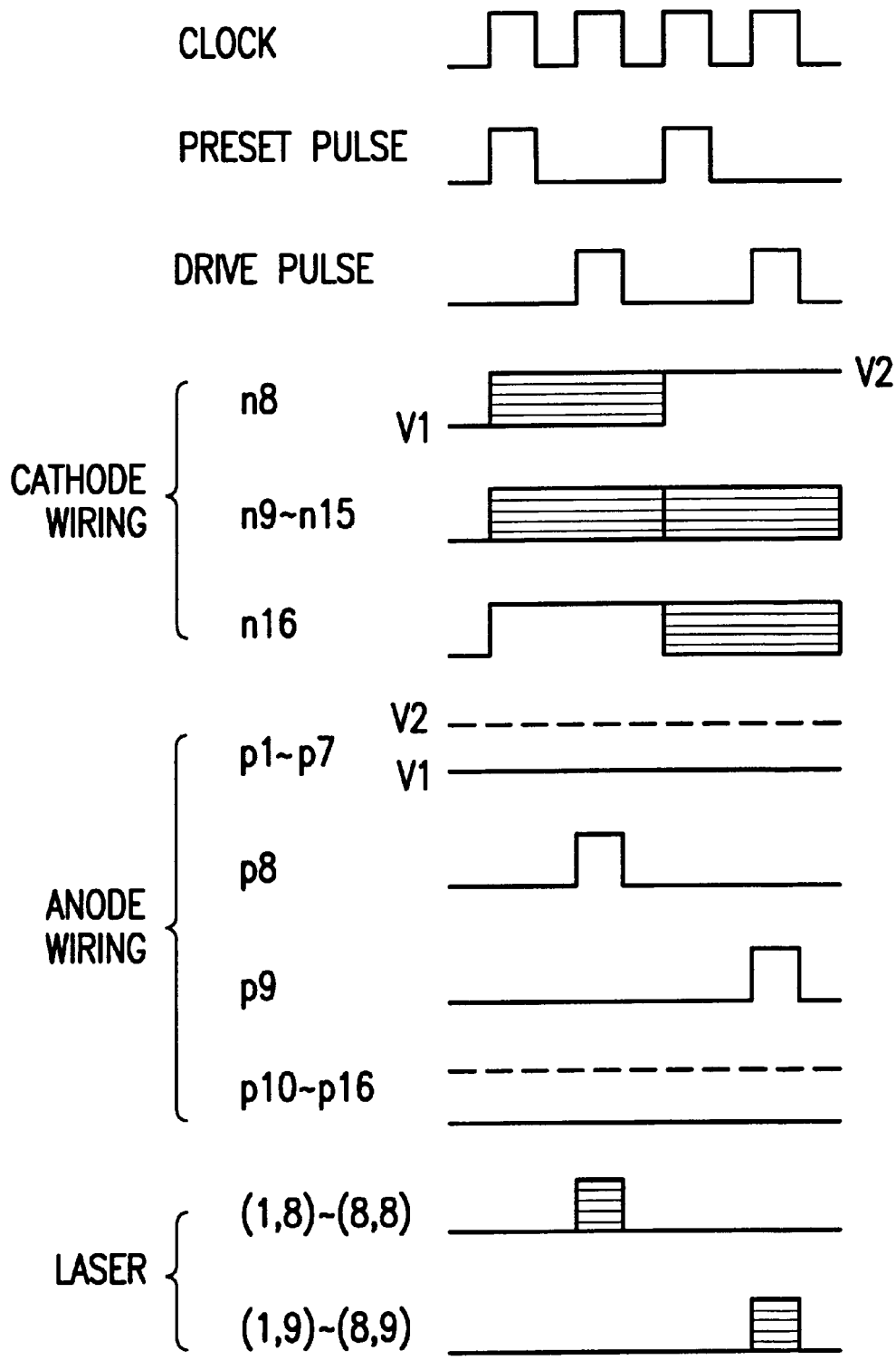
FIG. 9 is a diagram for explaining still another driving method of the present invention.

Second Driving Method . . . FIG. 9

In the second driving method, eight laser elements connected to one anode wire are driven simultaneously. As shown in FIG. 9, the preset pulses and the drive pulses are respectively obtained from one and another sequence of every second clock pulses, the preset pulses switch the bias voltage applied to the cathode wiring, and the drive pulses switch the driving voltage applied to the anode wiring.

In order to light simultaneously the eight laser elements (1,8) to (8,8) connected to the anode wire p8 and the cathode wires n15 to n8, respectively, the low voltage V1 is applied to the cathode wires n8 to n15 and the low voltage V1 is applied to the anode wire p1 to p7 and p9 to p15.

Under this condition, when the drive pulse is applied to the anode wire p8, the forward voltage, V2−V1, higher than the threshold voltage of laser 1 is applied simultaneously to the laser elements (1, 8) to (8, 8) and the laser elements (1, 8) to (8, 8) simultaneously emit light.

Next, the high voltage V2 is applied to the cathode wires n9 to n16 and the low voltage V1 is applied to the anode wire p2 to p8 and p10 to p16.

Under this condition, when the drive pulse is applied to the anode wire p9, the forward voltage higher than the threshold voltage is applied simultaneously to the laser elements (1, 9) to (8, 9) and the laser elements (1, 9) to (8, 9) simultaneously emit light.

In this way, eight laser elements connected to one anode wire can be simultaneously driven, and all the anode wires can be sequentially driven.

Third Driving Method . . . FIG. 9

In the third driving method, any number of the eight laser elements connected to one anode wire can be driven simultaneously.

In order to light any number of the eight laser elements (1, 8) to (8, 8) connected to the anode wire p8 simultaneously, the low voltage V1 is applied to the cathode wires connected to the lasers to be lit among the cathode wires n8 to n15, the high voltage V2 is applied to the cathode wires connected to the lasers not to be lit, and the low voltage V1 is applied to the anode wire p1 to p7 and p9 to p15.

Under this condition, when the drive pulse is applied to the anode wire p8, the forward voltage, V2−V1, higher than the threshold voltage of laser 1 is applied to those selected lasers which are connected to the cathode wires at the low voltage V1, and the selected lasers among the lasers (1, 8) to (8, 8) simultaneously emit light.

Next, in order to light any number of the eight laser elements (1, 9) to (8, 9) connected to the anode wire p9 simultaneously, the low voltage V1 is applied to the cathode wires connected to the lasers to be lit among the cathode wires n9 to n16, the high voltage V2 is applied to the cathode wires connected to the lasers not to be lit, and the low voltage V1 is applied to the anode wire p2 to p8 and p10 to p16.

Under this condition, when the drive pulse is applied to the anode wire p9, the forward voltage, V2−V1, higher than the threshold voltage of laser 1 is applied to those selected lasers which are connected to the cathode wires at the low voltage V1, and the selected lasers among the lasers (1, 9) to (8, 9) simultaneously emit light.

In this way, any selected lasers among the eight laser elements connected to one anode wire can be simultaneously driven, and all the anode wires can be sequentially driven.

Fourth Driving Method . . . FIG. 9

In the fourth driving method, eight laser elements connected to one anode wire are simultaneously driven while individually controlling the light intensity of each laser.

In order to control the light intensity of the eight laser elements (1, 8) to (8, 8) connected to the anode wire p8 individually and simultaneously, bias voltages VM8 to VM15 between the low voltage V1 and the high voltage V2 are applied to the cathode wires n8 to n15 depending on the required light intensity of the laser elements connected to the respective cathode wires, and the low voltage V1 is applied to the anode wire p1 to p7 and p9 to p15.

Under this condition, when the drive pulse is applied to the anode wire p8, forward voltages (V2−VM15) to (V2−VM8) are applied to the laser elements (1, 8) to (8, 8) and the laser elements (1, 8) to (8, 8) emit light with the intensity determined by the forward voltages (V2−VM15) to (V2−VM8), respectively. It is also possible to keep any one or several ones of the lasers unexcited by setting the respective bias voltages to the high voltage V2.

In this case, the pulsed emission of light from the laser elements (1, 8) to (8, 8) is not affected by voltages applied to the anode wires other than the anode wires p1 to p15 and voltages applied to the cathode wires other than the cathode wires n8 to n15. Therefore, for example, the eight lasers (1, 16) to (8, 16) connected to the anode wire p16 maybe driven for light emission independently in addition to the laser elements (1, 8) to (8, 8).

[Operation and effect of the oblique matrix wiring of the present invention]

As explained above, according to the oblique matrix wiring of the present invention as indicated by the examples of FIG. 1 to FIG. 6, each anode wiring 2 and each cathode wiring 3 are connected to m laser elements.

Therefore, when the electrostatic capacitance of one laser is assumed to be Co, the electrostatic capacitance connected to one wiring becomes mCo. Accordingly, when a voltage Va=V2−V1 is applied to the capacitance, a capacitive energy $E=(\frac{1}{2})mCova^2$ is stored in the capacitance. A portion of energy equal to E is consumed each time when the bias voltage of one wiring is changed to the low voltage V1 from the high voltage V2 or to the high voltage V2 from the low voltage V1.

The table in FIG. 10 lists the power consumption in the m×n laser array required for charging and discharging the capacitance of the wiring in various cases. The lasers are driven either one by one or m lasers connected to an anode wiring at a time.

In above computation, m is fixed to 8 and n is taken to be 20 and 200, Co=1 pF, Va=10V, and the driving period is set to 100 μsec. In the case of driving m lasers at a time, the following preset condition is assumed that the bias voltage of the cathode wring 3 is switched so that when the laser elements connected to the kth anode wiring light, the laser elements connected to the (k+1)th anode wiring do not light.

As will be apparent from the table in FIG. 10, according to the oblique matrix wiring of the present invention, the power consumption required for charging and discharging is reduced remarkably in comparison with the vertical and horizontal matrix wiring of the related art shown in FIG. 27. This effect becomes more distinctive as the number of elements n in the longer side direction of array becomes larger. The "four-section matrix wiring" in the table is the case where the row wiring and column wiring are divided into two sections in the vertical and horizontal matrix wiring explained above.

Moreover, according to the oblique matrix wiring of the present invention, since the electrostatic capacitance of each wiring is rather small, the response time required for the current to flow into the predetermined lasers may be reduced to a large extent in comparison with the vertical and horizontal matrix wiring of the related art. It will be explained on the basis of the computer simulation in the following.

First, the time dependence of the current flowing in the laser 1 is simulated in the case of the vertical and horizontal matrix wiring of the related art of FIG. 27 with m=8 and n=20 when voltage pulses are applied.

In this case, the material of the anode wiring 2 and cathode wiring 3 is assumed to be gold having the electric resistivity of $2.4\times10^{-6}$ Ω·cm and the wirings are set to 20 μm in width and 0.5 μm in thickness. The wiring pitch is set to 50 μm for both anode wiring 2 and cathode wiring 3. The electrostatic capacitance of one laser 1 is set to 1 pF, while the electric resistance to 500 Ω. The contact resistance at the contact area between the anode wiring 2 or cathode wiring 3 and the laser 1 is set to 4.6 Ω.

The anode pads 4 and cathode pads 5 are connected with a driving circuit for setting the drive voltage and the internal electric resistance of the driver is set to 50 Ω.

When only the laser (4, 10) is driven, the cathode pad of the fourth row is grounded and voltage pulses having a width of 20 nsec and a height of 10V is applied to the anode pad of the 10th row with a period of 60 nsec. The rising and falling times of the voltage pulse are set to 0.5 nsec. The cathode pads of the rows other than the fourth row are all grounded via a resistance of 10MΩ and the anode pads of the rows other than the 10th row are all grounded via a resistance of 50 Ω.

Figure 11:
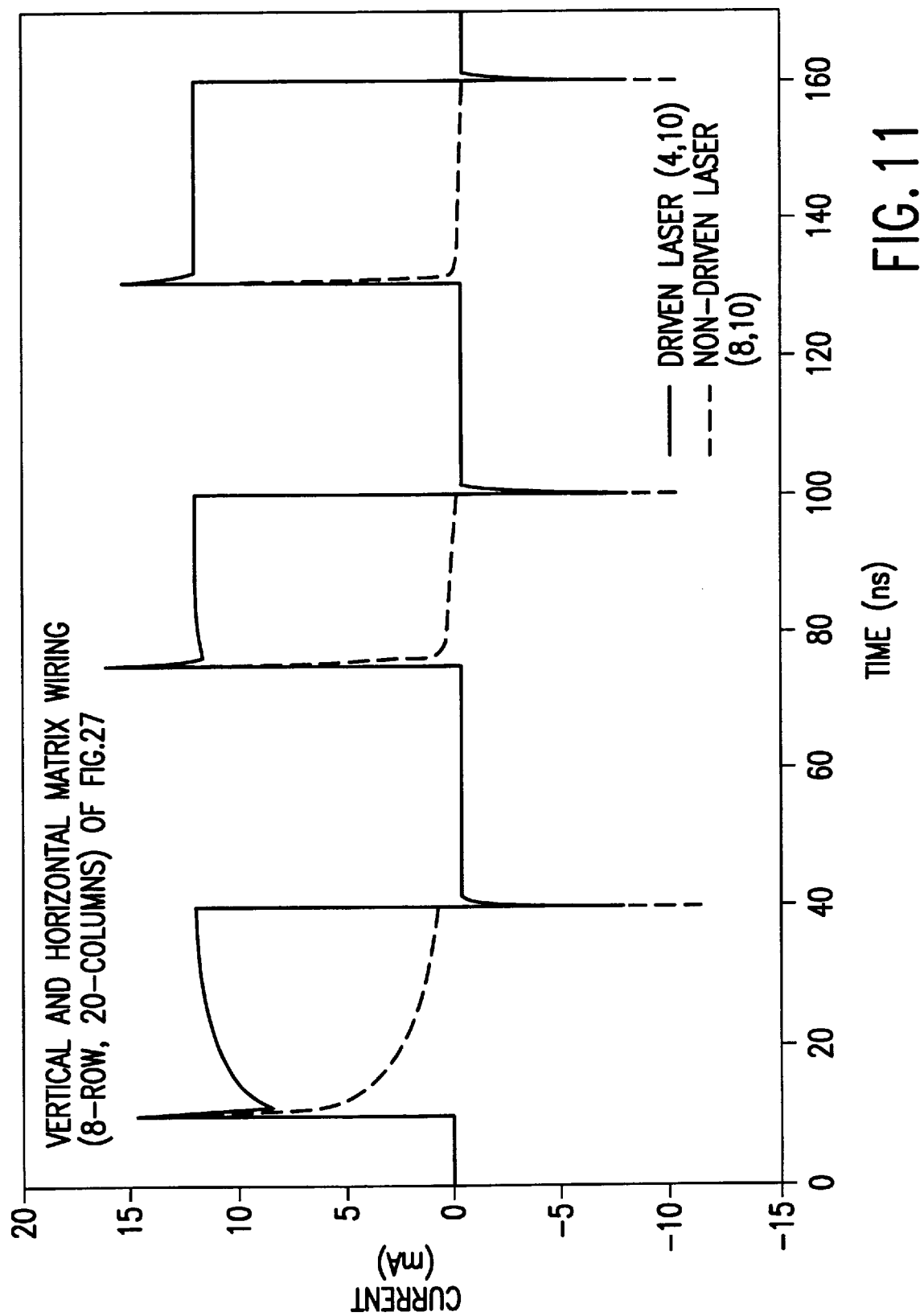
FIG. 11 is a diagram showing the characteristics of the matrix-wiring of the related art.

The current flowing into the laser (4, 10) is indicated by a solid line in FIG. 11. The first pulse current is not rectangular and is deformed. It is because a current for charging the electrostatic capacitance of all laser elements not driven flows into the cathode wiring via the lasers connected to the same anode wiring as the laser (4, 10).

The current flowing into a not-driven laser (8, 10) connected to the same anode wiring is shown in FIG. 11 by a broken line. Immediately after the pulse is impressed to the laser (4, 10), a current almost of the same level as that of the laser (4, 10) flows into the laser (8, 10). But, thereafter, the current decreases rapidly and becomes zero after about 30 nsec. Namely, after 30 nsec, a current does not flow to charge the electrostatic capacitance of the not-driven lasers and at the same time the current of the laser (4, 10) becomes constant.

Therefore, the desired current can be obtained by applying a voltage pulse having the pulse width which is sufficiently longer than 30 nsec.

However, when the number of laser elements in the array is increased, the current pulse waveform is more deformed, making it difficult to drive the array with voltage pulses. In the next calculation, the time dependence of the current flowing in the laser 1 is simulated in the case of the vertical and horizontal matrix wiring of the related art of FIG. 27 with m=8 and n=200. The constants and the driving method used for the calculation are the same as in the first calculation.

Figure 12:
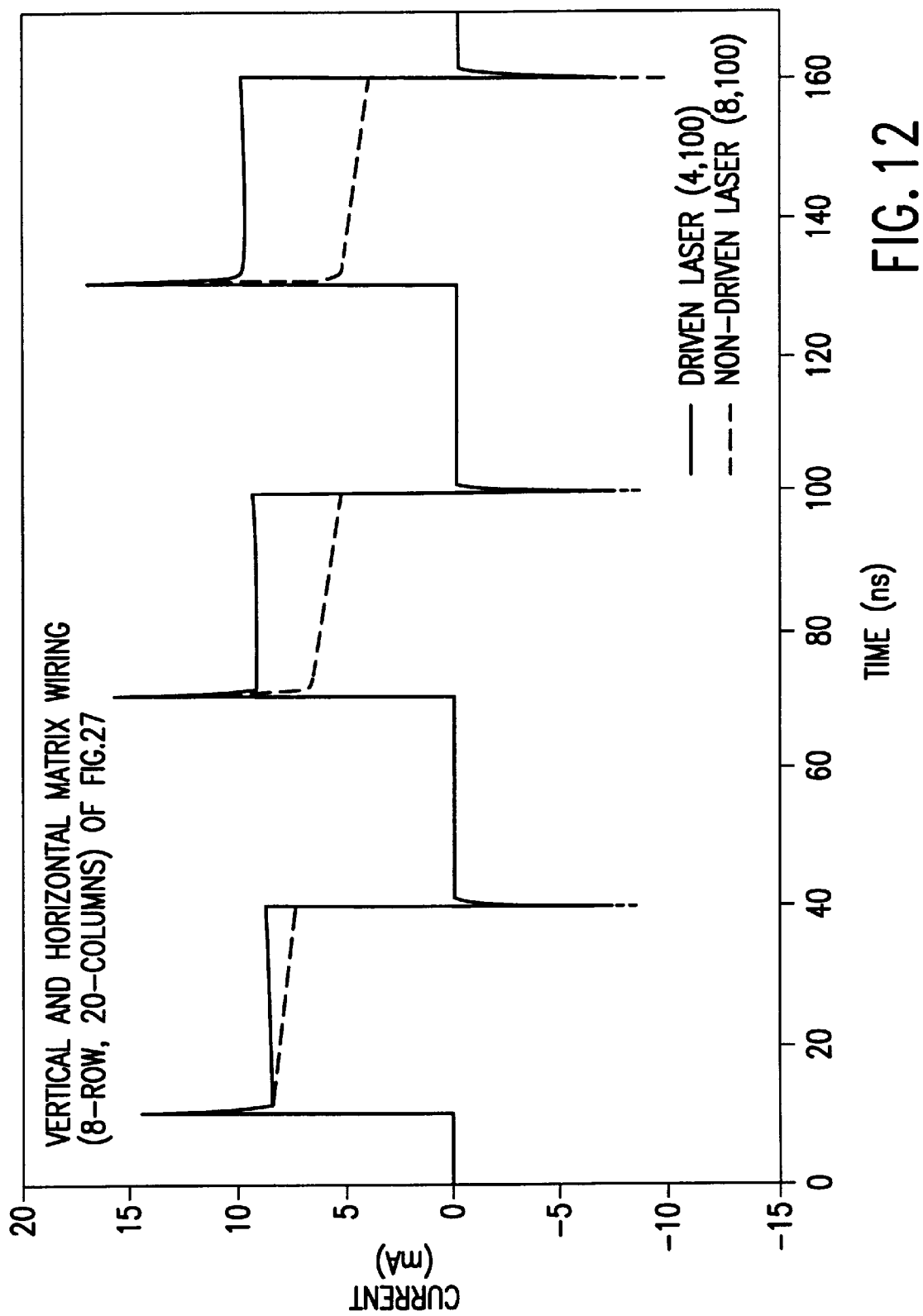
FIG. 12 is a diagram showing the characteristics of the matrix-wiring of the related art.

When only the laser (4, 100) is driven, the current flowing into the laser (4, 100) is indicated by a solid line in FIG. 12 and the current flowing into a not-driven laser (8, 100) connected to the same anode wiring is indicated by a broken line of FIG. 12. The current flowing into the laser (4, 100) has a rectangular shape but the current value is actually rising gradually and does not reach a constant value. About 200 nsec may be required until the current value reaches a constant value.

Therefore, the constant current can be obtained by applying a voltage pulse having the pulse width which is sufficiently longer than 200 nsec. If the laser array cannot be modulated at a higher speed, its range of applications may be limited.

There is another difficult problem that a large current flows into the not-driven lasers connected to the same anode wiring and its decay time is long. Because of this current the not-driven lasers emit light.

A high bias voltage may be applied to the cathode wiring 3 so that a current for charging the electrostatic capacitance of laser 1 does not flow in the vertical and horizontal matrix wiring of FIG. 27. This driving method will be explained below.

In the case of driving only the laser (4, 100) in the vertical and horizontal matrix wiring of FIG. 27 with m=8 and n=200, the drive pulse which changes between the low voltage V1 and high voltage V2 is impressed to the anode wiring of the 100th column under the condition that the low voltage V1 is applied to the cathode wiring of fourth row connecting the laser (4, 100), the high bias voltage V2 is applied to the cathode wiring of the other first to third rows and fifth to eighth rows and the low voltage V1 is applied to the anode wiring of the first to 99th columns and 101st to 200th columns, except for the anode wiring of the 100th column connected to the laser (4, 100).

Thereby, a forward voltage V2−V1 is impressed only to the laser (4, 100) to allow a current to flow. The current flowing into the laser (4, 100) is indicated by a solid line in FIG. 13 and the current flowing into a non-driven laser (8, 100) in the same column is indicated by a broken line.

The pulse current flowing into the laser (4, 100) does not change in shape between the first pulse and the second and third pulse. The pulse current may be injected to the laser (4, 100) with good reproducibility. At the same time, little current flows into the other lasers of the same column. Namely, the charging current is negligible. Accordingly, the problem that the non-driven lasers of the same column emit light is eliminated.

Figure 13:
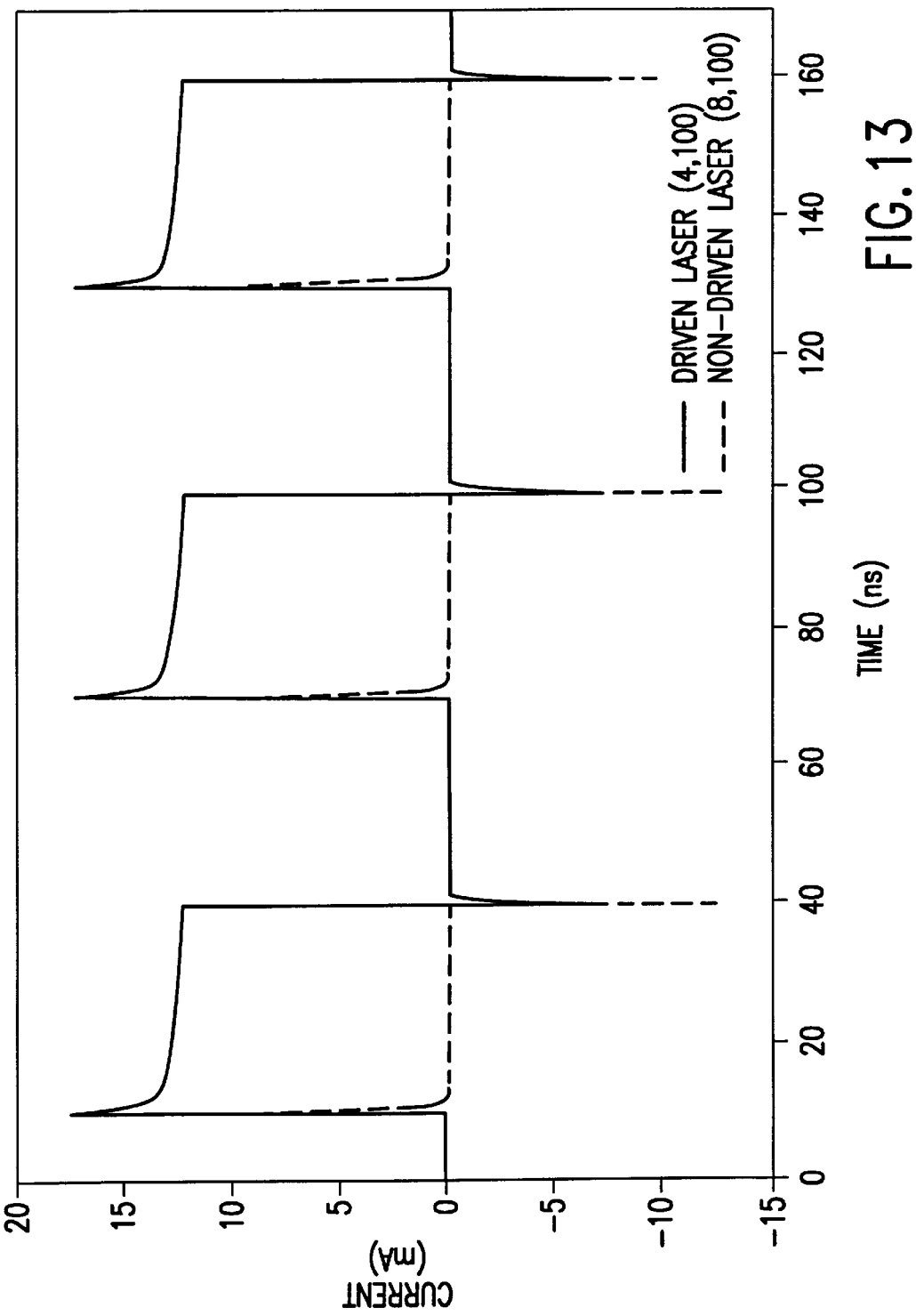
FIG. 13 is a diagram showing the characteristics of the matrix-wiring of the related art.

However, in this case, as will be apparent from FIG. 13, there is another problem. Namely, rectangular characteristic of the pulse current flowing into the driven laser (4, 100) is deteriorated. That is, a current value becomes large at the rising edge of the pulse current and then lowered as the time passes.

In other words, since the current value is not constant but gradually reduced, the intensity of light emitted from the driven laser (4, 100) decreases. This tendency becomes more distinctive when the number of elements of array increases. It is because an inverse voltage is applied to the other laser connected to the cathode wiring of the same row as the driven laser (4, 100) and a current for charging the electrostatic capacitance flows into the laser.

Moreover, when the bias voltage of the cathode wiring 3 is changed to the high voltage V2 from the low voltage V1 or to the low voltage V1 from the high voltage V2, the response is delayed and a large current flows into the cathode wiring.

Figure 15:
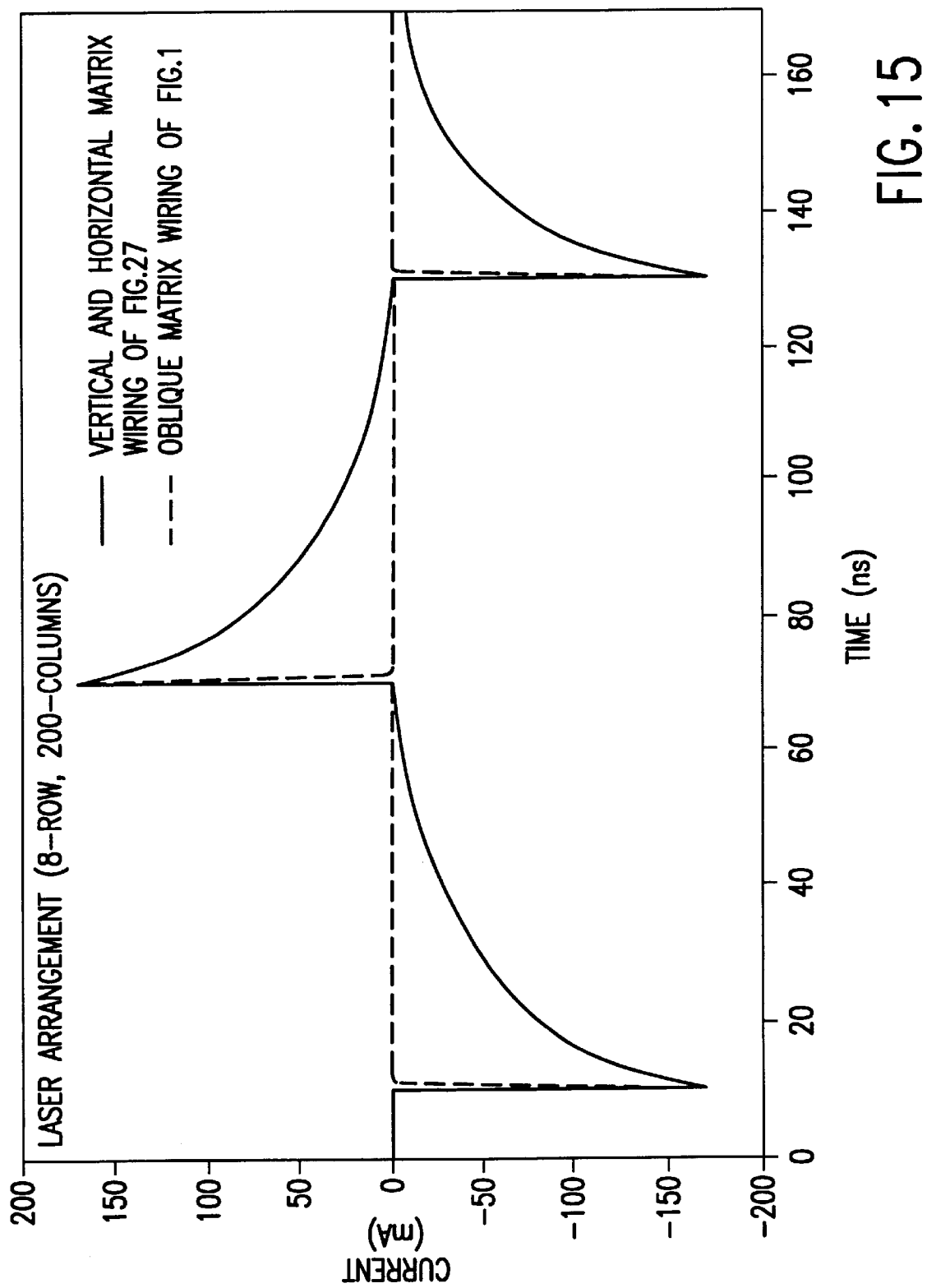
FIG. 15 is a diagram showing a result of comparison of the characteristics of the methods of matrix-wiring of the present invention and of the related art.

The result of calculation for the current of the cathode wiring connected to the laser (4, 100) is indicated by a solid line in FIG. 15 when the bias voltage is changed to the high voltage V2 from the low voltage V1 and to the low voltage V1 from the bias voltage V2. As explained above, a large current flows for charging or discharging the electrostatic capacitance of n laser elements connected to the cathode wiring.

According to the oblique matrix wiring of the present invention, the problems explained above can be resolved very effectively. In the next calculation, the time dependence of the current flowing in the laser 1 is simulated in the case of the oblique matrix wiring of the present invention like the example of FIG. 1 with m=8 and n=200 where the anode wiring 2 is set vertical to the longer side of the array and the cathode wiring 3 is set with an inclination angle of 135 degrees to the longer side of the array.

The anode wiring 2 and cathode wiring 3 are made of gold in the width of 20 μm and thickness of 0.5 μm as in the case of the vertical and horizontal matrix wiring explained above. The first driving method described in the section of the driving method for two-dimensional surface light emitting laser array is employed. The calculation is made for driving only the laser (4, 100) under the conditions explained above.

Figure 14:
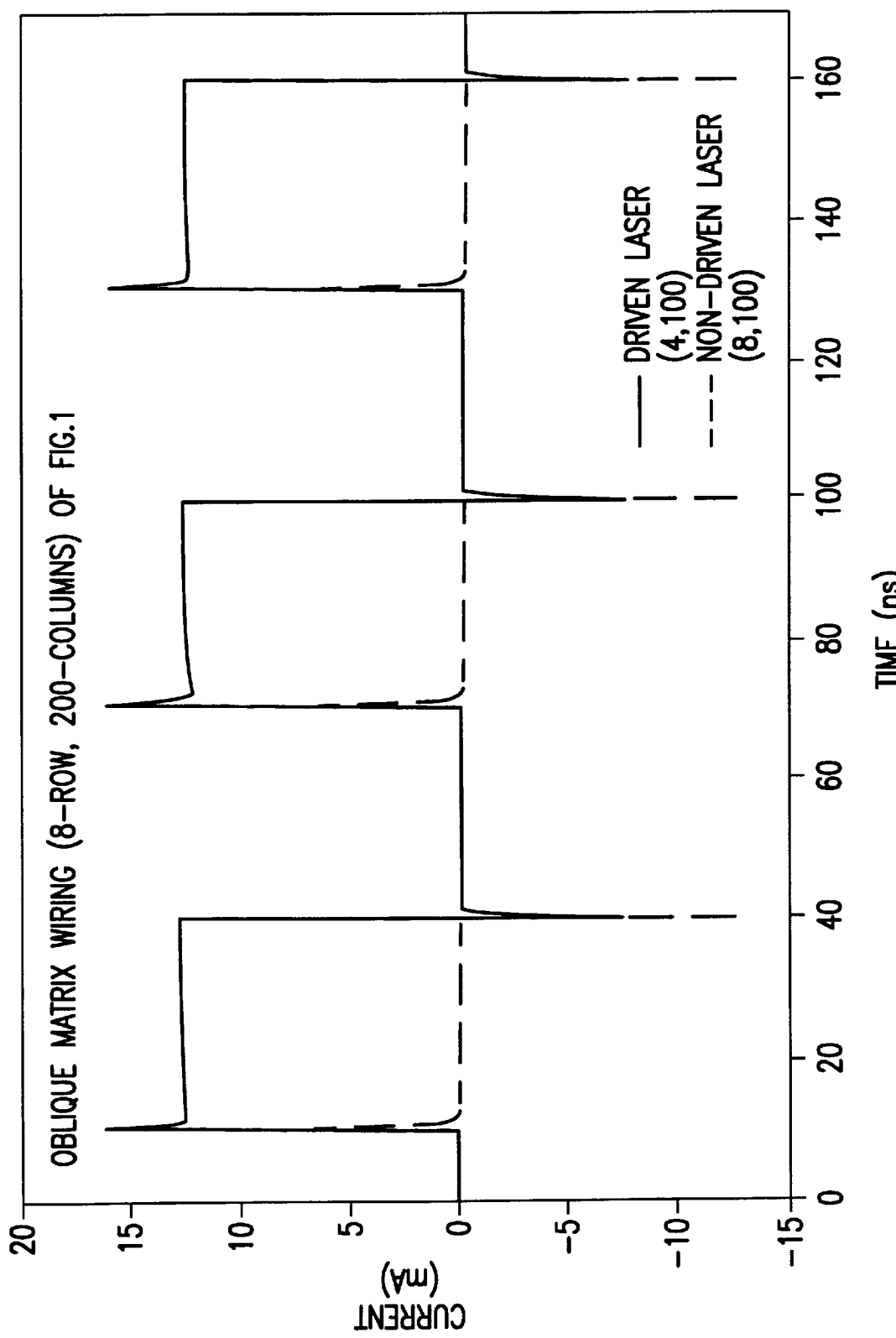
FIG. 14 is a diagram showing the characteristics of the matrix-wiring of the present invention.

FIG. 14 shows the current flowing into the laser (4, 100) with a solid line and the time dependence of a current flowing into the laser (8, 100) not driven in the same column with a broken line. The current flowing into the driven laser (4, 100) shows a rectangular shape with little deformation, indicating no decrease in the current value during application of the drive pulse which has been observed in the vertical and horizontal matrix wiring. Therefore, the problem that the intensity of light emission of the driven laser (4, 100) is changed has been eliminated. Moreover, little current flows into the not-driven lasers in the same column.

In addition, when the bias voltage of the cathode wiring 3 is changed to a high voltage V2 from a low voltage V1 or to a low voltage V1 from a high voltage V2, the response is quick and the flowing current is small. The result of calculation of the current of the cathode wiring connected to the laser (4, 100) is shown in FIG. 15 by a broken line when the bias voltage is changed to a high voltage V2 from a low voltage V1 or to a low voltage V1 from a high voltage V2.

[Embodiment as an image forming apparatus]

The two-dimensional surface light emitting laser array of the present invention may be used as a light source for exposing process of an image forming apparatus to form an image on a photosensitive material such as a laser beam printer and a copying machine of the electro-photographic system.

Figure 16:
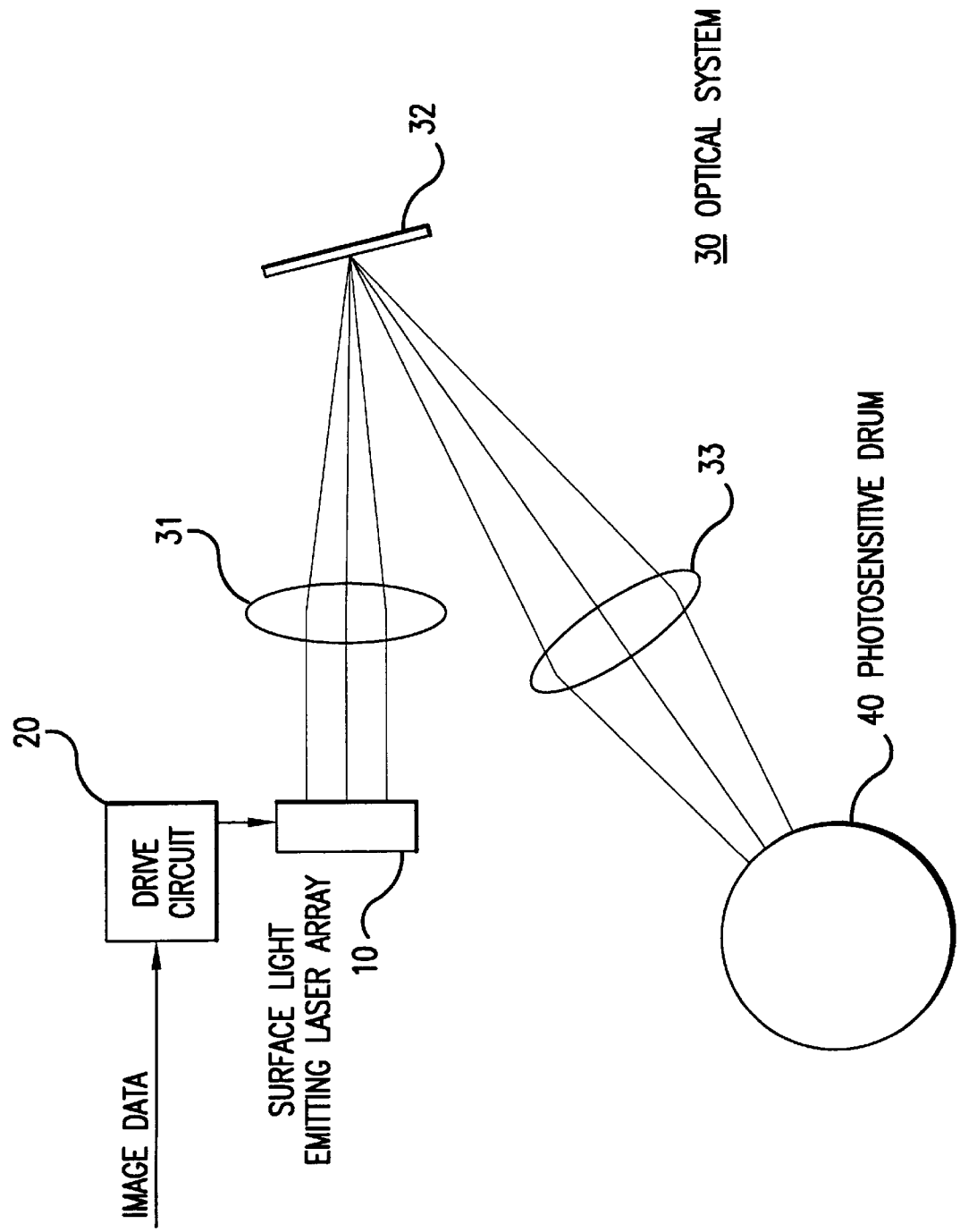
FIG. 16 is a diagram showing an example of an image forming apparatus of the present invention.

Structural Example of the Apparatus as a Whole . . . FIG. 16

FIG. 16 shows an essential portion of an example of the image forming apparatus such as a laser beam printer utilizing the two-dimensional surface light emitting laser array of the present invention as a light source for exposing process. The image forming apparatus comprises a two dimensional surface light emitting laser array 10, a driving circuit 20, an optical system 30, a photosensitive material drum 40 and a charger for charging the photosensitive material drum 40, a developing unit for developing an electrostatic latent image formed on the photosensitive material drum 40 to a toner image, a transfer unit for transferring the developed toner image on a recording paper sheet and a fixing unit for fixing the toner image transferred on the recording sheet which are not illustrated in FIG. 16.

As the surface light emitting laser array 10, a surface light emitting laser array like examples shown in FIG. 1 to FIG. 6 may be used basically but other examples will be explained later. The driving circuit 20 is used to drive the surface light emitting laser array 10 with the designated scanning pattern depending on the image data and its example will be explained later.

The optical system 30 is composed, for example, of a spherical lens 31 for receiving all laser beams emitted from the surface light emitting laser array 10, a mirror 32 for reflecting the laser beams having transmitted through the spherical lens 31 and a cylindrical lens 33 for focusing the laser beams reflected by the mirror 32 on the photosensitive material drum 40.

Examples of Two-Dimensional Surface Light Emitting Laser Array as the Light Source for Exposing Process . . . FIG. 17 to FIG. 22

Figure 17:
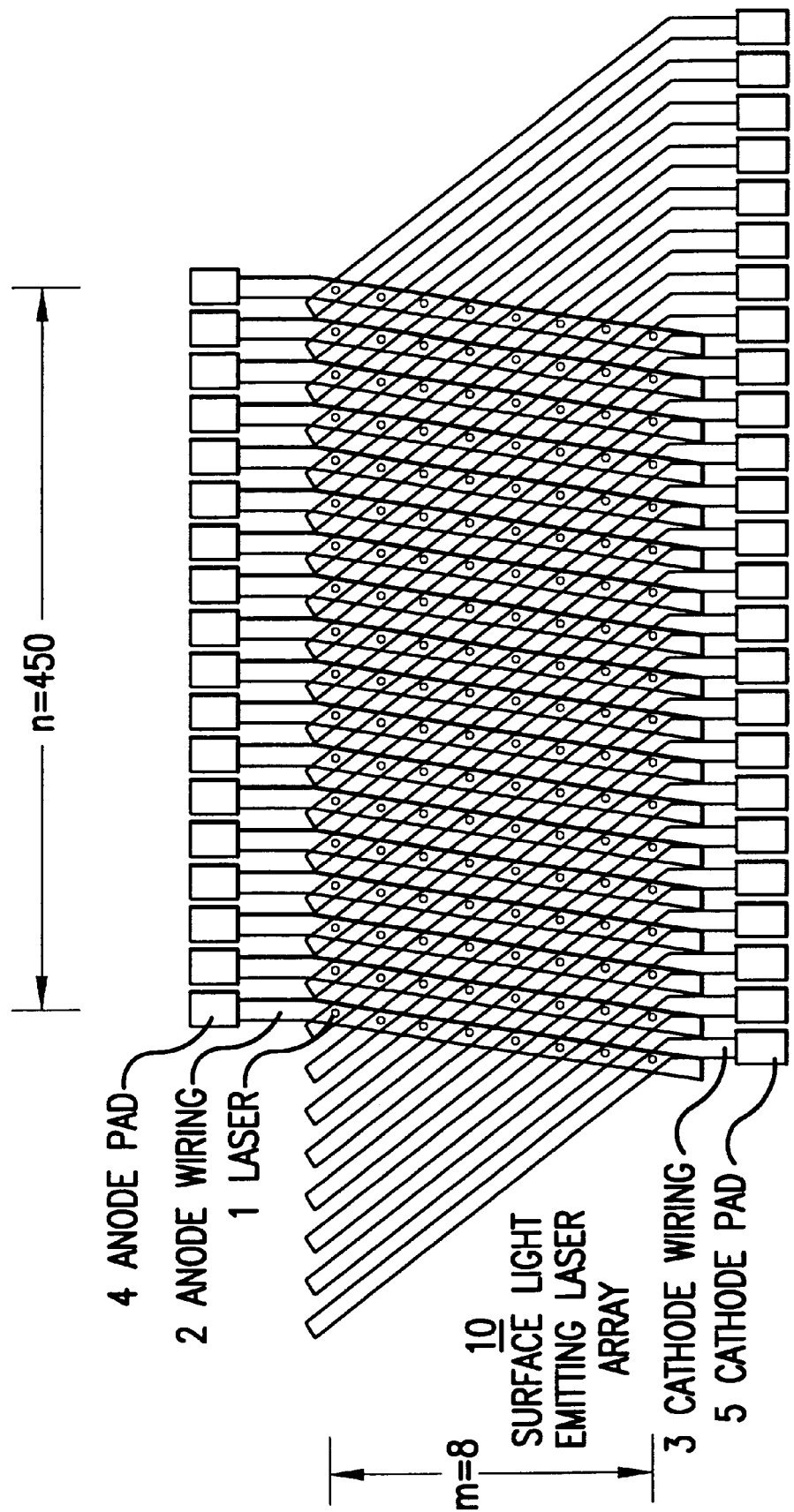
FIG. 17 is a diagram showing still another example of the two-dimensional surface light emitting laser array of the present invention.

FIG. 17 shows an example of the surface light emitting laser array shown in FIG. 16. In this example, there is a difference from the examples shown in FIG. 1 and FIG. 2. Namely, the laser elements 1 are arranged in two dimensions within a parallelogram having the longer side in the horizontal direction on a semiconductor substrate in such a manner that n laser elements are provided in the longer side direction, namely in the horizontal direction, while m laser elements are provided in the shorter side direction, namely in the direction a little inclined from the vertical direction, the anodes of the m laser elements arranged in the shorter side direction are connected to the anode wiring 2 and the cathode of the m laser elements arranged in the direction inclined from the shorter side and longer side directions are connected to the cathode wiring 3.

Figure 18:
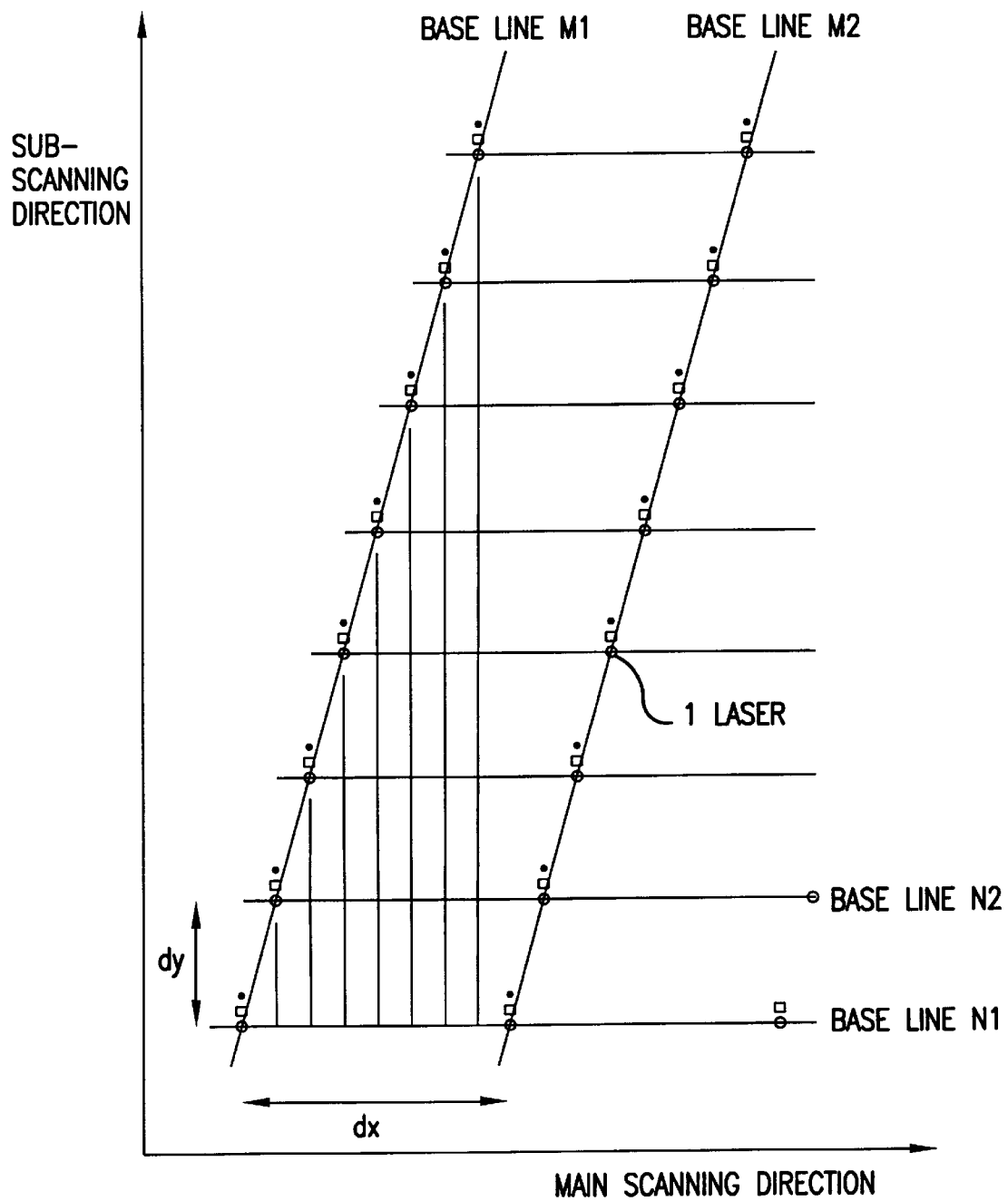
FIG. 18 is a diagram for explaining the two-dimensional surface light emitting laser array of FIG. 17.

In other words, as shown in FIG. 18, the base lines N1, N2, . . . are assumed to be parallel to the longer side direction and equally spaced and the base lines M1, M2, . . . are assumed to be a little inclined from the vertical direction and equally spaced. Moreover, laser elements 1 are arranged at the intersecting points of the base lines N1, N2, . . . and base lines M1, M2, . . . in such a manner that when the laser elements are projected on the base line N1, these are arranged at an equal interval of dx/m where dx is the interval of the base lines M1, M2, . . . in the direction of the base line N1.

The direction of the base line N1 corresponds to the main scanning direction which is the axial direction of the photosensitive material drum 40 and the vertical direction corresponds to the sub-scanning direction which is the rotating direction of the photosensitive material drum 40 or the feeding direction of recording paper.

As an example, the total number of the laser elements 1 is assumed to be 3600 spots by the setting m=8 and n=450. Thereby, printing can be implemented in a width of 300 mm with a resolution of 300 dpi (dot/inch) by expanding the laser beams through the optical system 30 and setting the interval of spots projected on the photosensitive material drum 40 to 85 μm.

Figure 19:
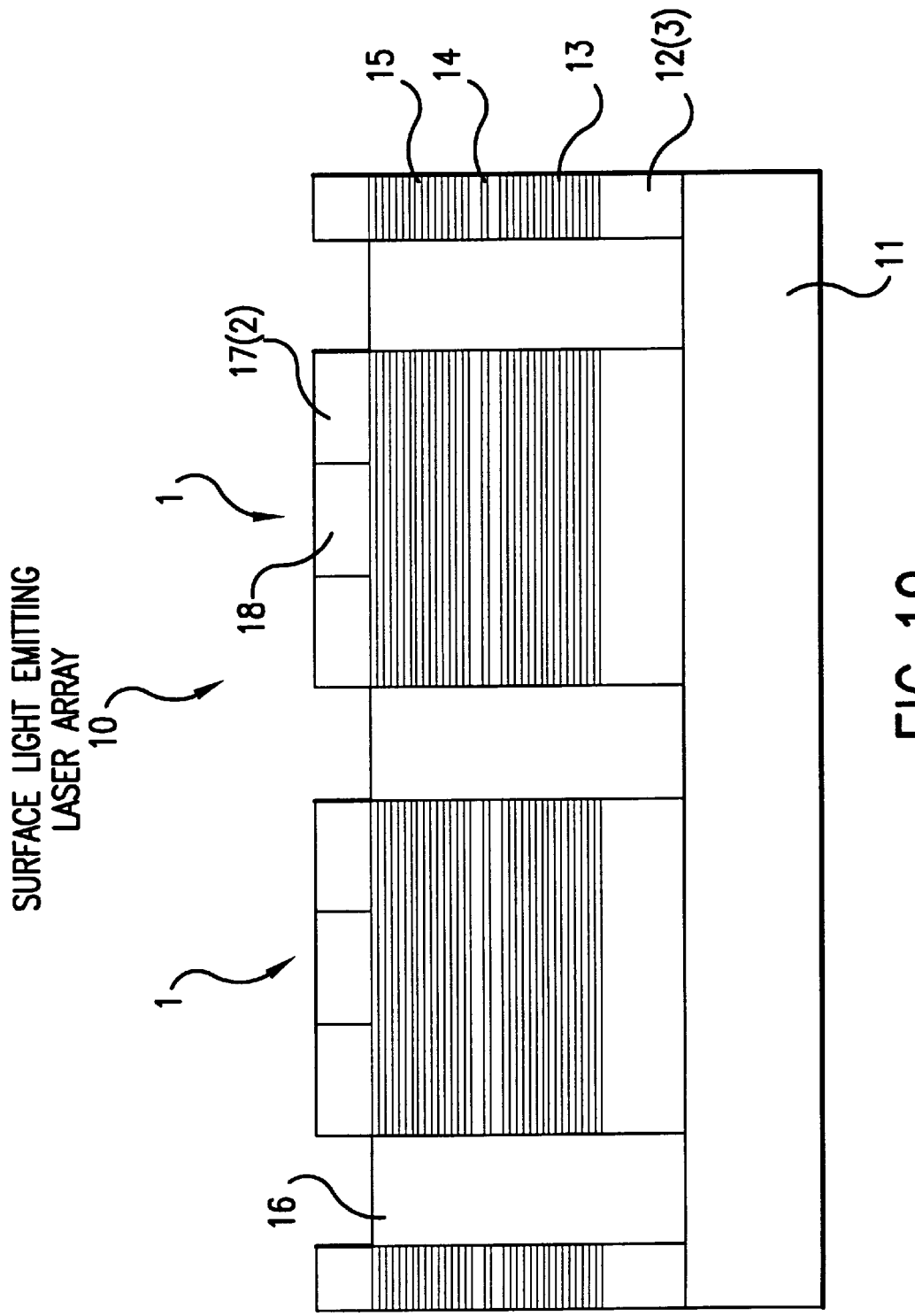
FIG. 19 is a diagram showing an example of the cross-sectional structure of the two-dimensional surface light emitting laser array.

FIG. 19 shows an example of a cross-sectional structure of the surface light emitting laser array 10 shown in FIG. 17. As shown in the figure, an n-GaAs conductive layer 12 forming a cathode wiring 3, an n-DBR mirror layer 13, an active layer 14 held by a spacer and a p-DBR mirror layer 15 are sequentially formed on a GaAs substrate 11 and the elements are electrically isolated by forming an insulating region 16 through dry etching and implantation. Thereafter, AuZu or Cr/Au is vacuum deposited on the p-DBR mirror layer 15 to form a conductive layer 17 constituting an anode wiring 2 and a light emitting aperture 18 is provided in the conductive layer 17.

The n-GaAs conductive layer 12, namely the cathode wiring 3 has a width of 40 μm, a thickness of 4 μm, a length of 1 mm, and a resistivity of $1 \times 10^5$ Ω·m and wiring resistance is 62.5 Ω. When the conductive layer 17 consisting of AuZn or Cr/Au, namely the anode wiring 2 has a width of 40 μm, a thickness of 0.5 μm, a length of 1 mm, and a resistivity of $2 \times 10^{-8}$ Ω·m and its wiring resistance is 1 Ω. When the electrostatic capacitance of one laser element is 3 pF the electrostatic capacitance of one wiring is 24 pF.

Figure 20:
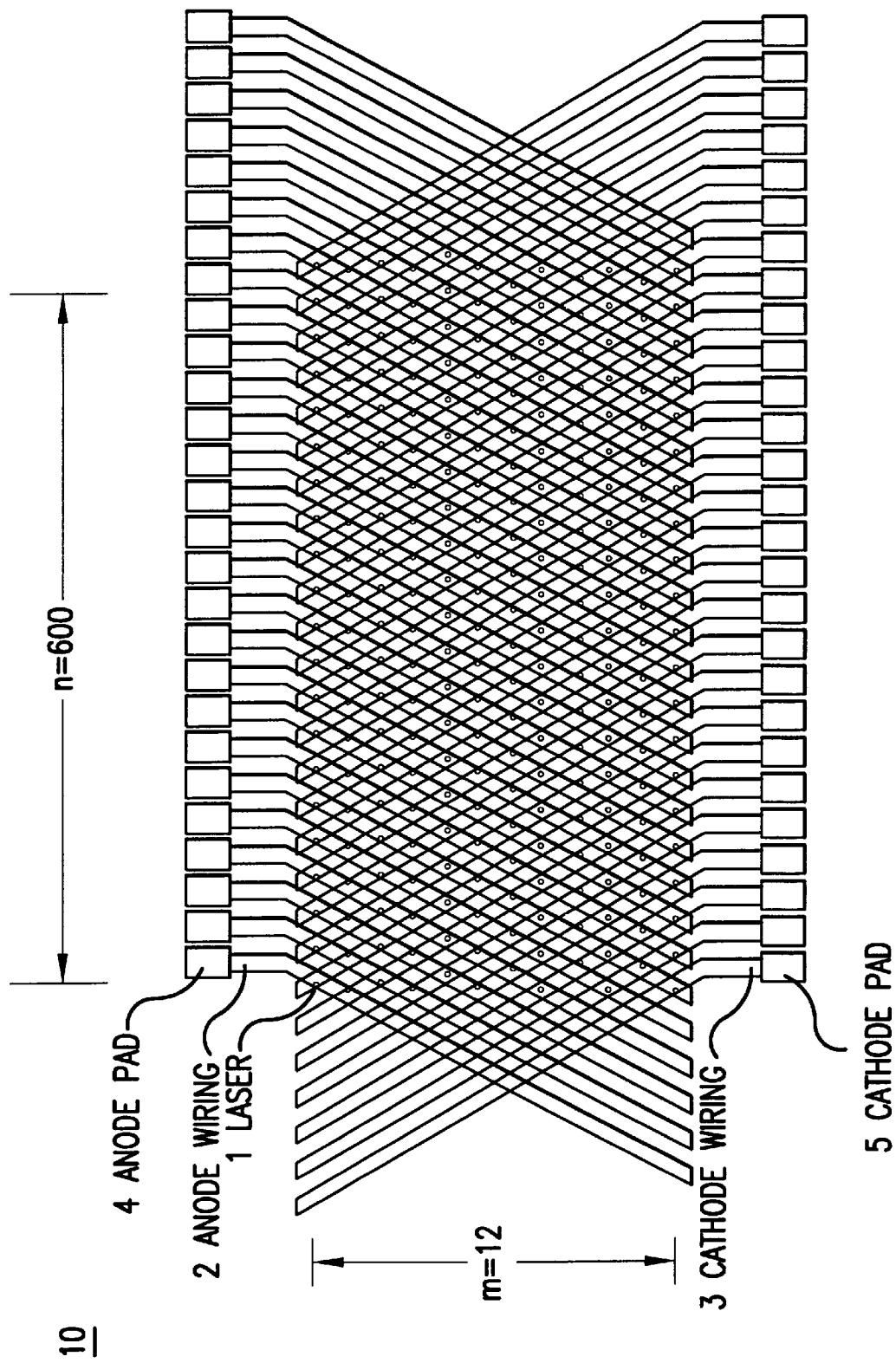
FIG. 20 is a diagram showing still another example of the two-dimensional surface light emitting laser array of the present invention.

FIG. 20 shows another example of the surface light emitting laser array 10 shown in FIG. 16. In this example, the laser elements 1 are arranged in a zigzag, in contrast with unlike the example of FIG. 17.

Figure 21:
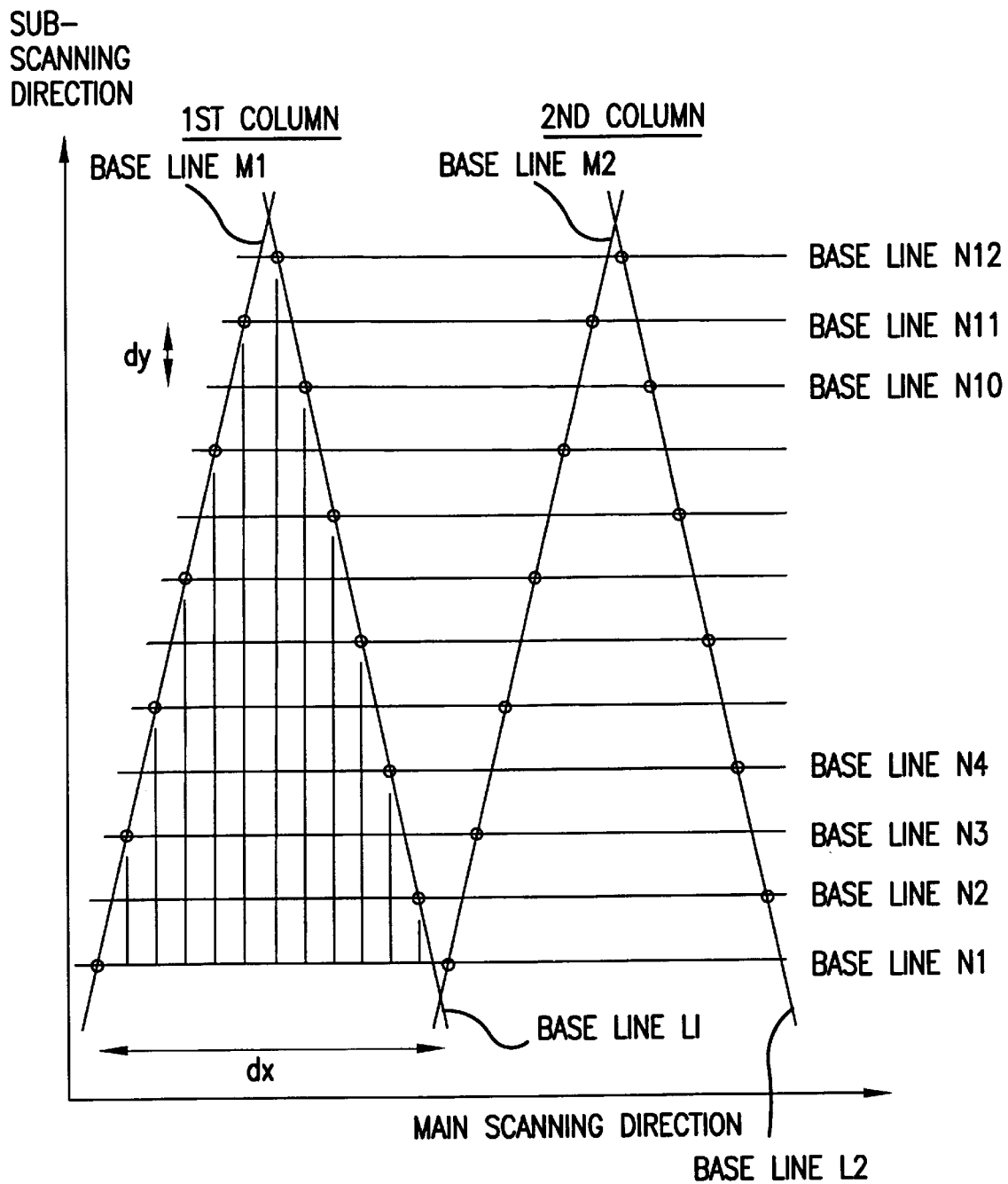
FIG. 21 is a diagram for explaining the two-dimensional surface light emitting laser array of FIG. 20.

Namely, in this example, n laser elements are arranged in the horizontal direction, while m laser elements are arranged on V-shaped lines in the almost vertical direction. For example, when m=12, the base lines N1, N2, N4, . . . N10, N11, N12 are assumed to be parallel to the longer side direction to the base lines M1, M2, . . . are assumed to be a little inclined in one direction from the vertical direction and the base lines L1, L2, . . . are assumed to be a little inclined in the opposite direction as shown in FIG. 21.

For the first column of the array, the laser elements 1 are arranged at the intersecting points between the base lines N1, N3, . . . , N11 and base line M1 and between the base lines N12, N10, . . . , N4, N2 and the base line L1 in such a manner that when lasers are projected on the base line N1, these are arranged with an equal interval of dx/m where dx is the interval of the base lines M1, M2, . . . in the direction of the base line N1. This structure is also applied to the second and subsequent columns.

Therefore, m laser elements of each column are not arranged in a line in the column direction but they are arranged in zig-zag on two base lines which are a little inclined in the opposite directions with each other to the vertical direction. As shown in FIG. 20, the anode wiring 2 and cathode wiring 3 are formed in directions inclined to the row and column directions. The anodes the anode of m laser elements arranged close to an anode wiring 2 are connected to the anode wiring 2 and the cathodes of m laser elements arranged close to a cathode wiring 3 are connected to the cathode wiring 3.

In this example, 7200 spots of lasers 1 in total can be obtained by setting m=12 and n=600.

In this example, the wiring resistance of the cathode wiring 3 is 125 Ω if it is formed as an n-GaAs conductive layer having a width of 20 μm, a thickness of 4 μm, a length of 1 mm, and a resistivity of $1 \times 10^{-5}$ Ω·m. The wiring resistance of the anode wiring 2 is 2 Ω if it is formed as a conductive layer consisting of AuZn or Cr/Au having a width of 20 μm, thickness of 0.5 μm, a length of 1 mm, and a resistivity of $2 \times 10^{-8}$ Ω·m. When the electrostatic capacitance of one laser element is 0.8 pF and electrostatic capacitance of one wiring is 9.6 pF.

Figure 22:
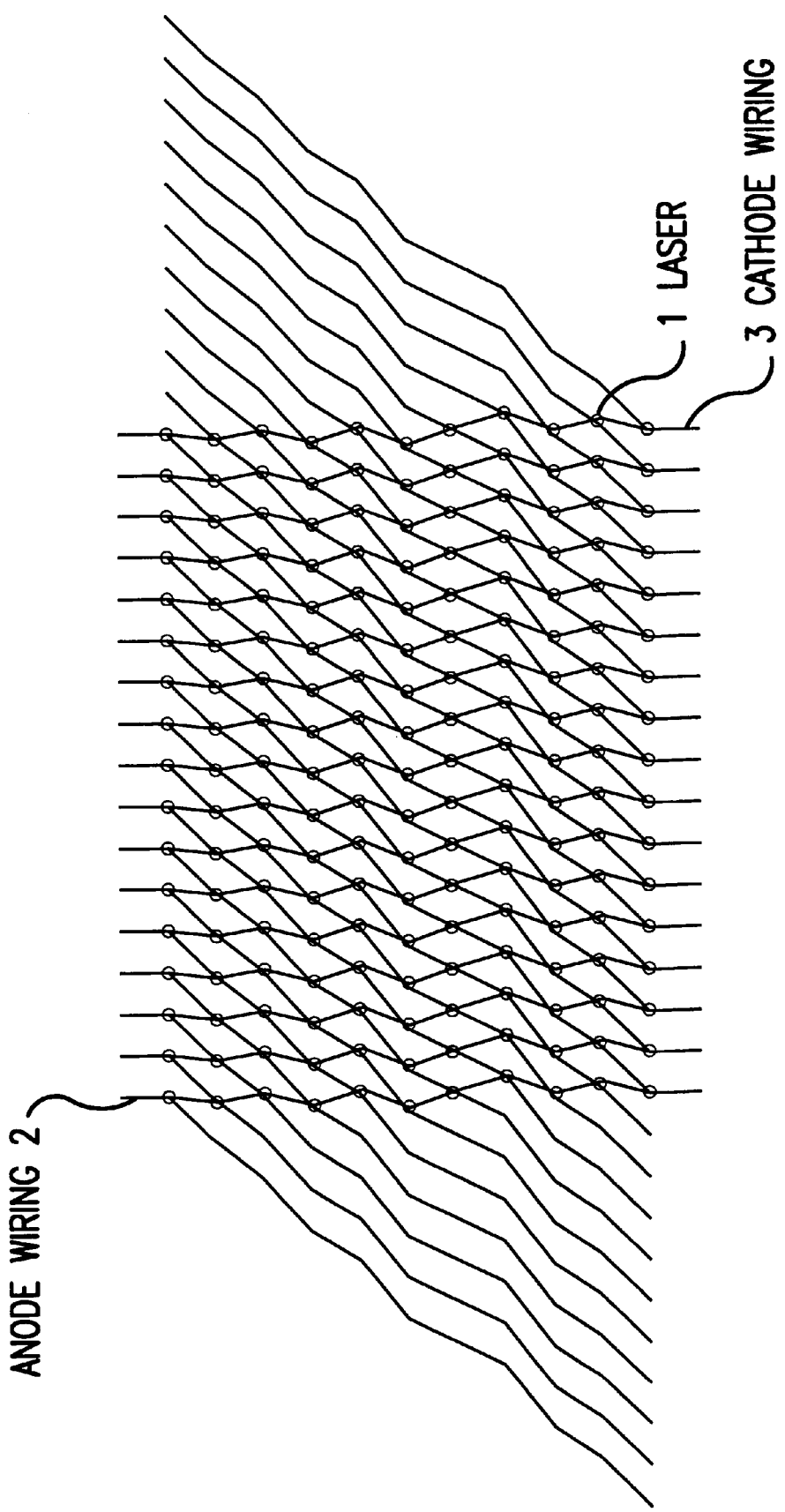
FIG. 22 is a diagram showing still another example of the two-dimensional surface light emitting laser array of the present invention.

As shown in FIG. 22, the anode wiring 2 and cathode wiring 3 may also be formed in a zig-zag shape in place of a linear shape.

Figure 23:
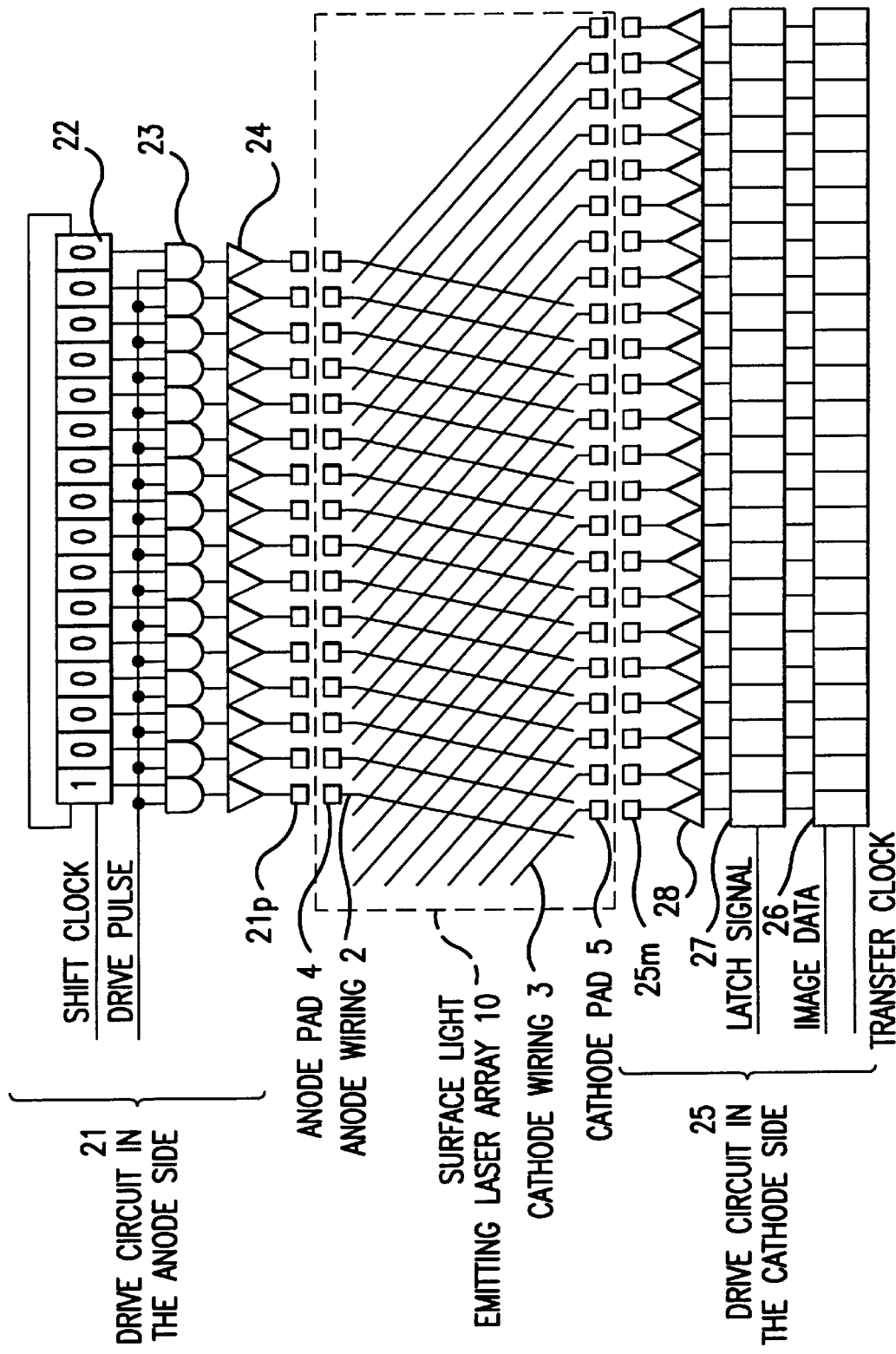
FIG. 23 is a diagram showing an example of the driving circuit for realizing the driving method of the present invention.

FIG. 23 shows an example of the driving circuit 20 shown in FIG. 16. This example shows a method of driving the surface light emitting laser array 10 shown in FIG. 17. The driving circuit 20 is divided into the anode side driving circuit 21 and the cathode side driving circuit 25.

The anode side driving circuit 21 is composed of a ring shift register 22 as a selecting means for selecting a desired anode wiring and an AND gate 23 as a gating means for supplying the drive pulse only to the anode wiring selected by the ring shift register 22.

However, the ring shift register 22 and AND gate 23 are formed in practice of a logic IC such as a TTL (Transistor-transistor-Logic). Therefore, an output level of the AND gate 23 is a logic level such as the TTL level.

Therefore, a voltage amplifying circuit 24 is provided at the output side of the AND gate 23 to convert this logic level to the drive level of the surface light emitting laser array 10. The voltage amplifying circuit 24 is formed of an operational amplifier or transistors.

At the output side of the voltage amplifying circuit 24, a pad 21p is provided and this pad 21p is connected to an anode pad 4 of the surface light emitting laser array 10.

The cathode side driving circuit 25 is composed of a shift register 26 for temporarily storing the image data, a latch circuit 27 for latching the image data from the shift register 26 and a voltage amplifying circuit 28 for converting, the logic level of the output of the latch circuit 27 to the drive level of the surface light emitting laser array 10.

The surface light emitting laser array 10 can be driven without latching the image data from the shift register 26 with the latch circuit 27, but the driving interval of the surface light emitting laser ray 10 can be reduced by latching the image data with the latch circuit 27, because the image data may be subjected to the serial/parallel conversion with the shift register 26, while the surface light emitting laser array 10 is being driven, as will be explained later.

At the output side of the voltage amplifying circuit 28, a pad 25m is provided and this pad 25m is connected to the cathode pad 5 of the surface light emitting laser array 10. An example of the driving surface light emitting laser array 10 by means of the anode side driving circuit 21 and cathode side driving circuit 25 as explained using the timing chart of FIG. 24, above. The eight lasers connected to the fifth anode wiring from the left are driven at first and then the eight lasers connected to the sixth anode wiring from the left are driven. Each wiring number or bit number is to be counted from the left.

First, eight image data used for the first drive are inputted to the shift register 26 of the cathode side driving circuit 25 by eight transfer clock pulses. Then, the eight image data are transferred further for four bits into the shift register 26 by means of the four transfer clock pulses. At this point eight image data are stored in the fifth to 12th bits of the shift register 26 as indicated as the shaded area of FIG. 23.

In this case, one image data is a 1-bit data of "0" (low level) or "1" (high level) and it is converted to the low voltage V1 or high voltage V2 by the voltage amplifying circuit 28.

Then, the latch signal is supplied to the latch circuit 27. Thereby, the eight image data are transferred in parallel to the latch circuit 27 from the fifth to 12th bits of the shift register 26. Accordingly, the low voltage V1 or high voltage V2 is applied to the eight cathode wirings connected to the fifth anode wiring via the lasers to be driven.

Next, in the anode side driving circuit 21, four shift clock pulses are supplied to the ring shift register 22 to select the fifth anode wiring and thereby the high level signal originally inputted in the first bit of the ring shift register 22 as shown in FIG. 23 is shifted to the fifth bit.

Figure 24:
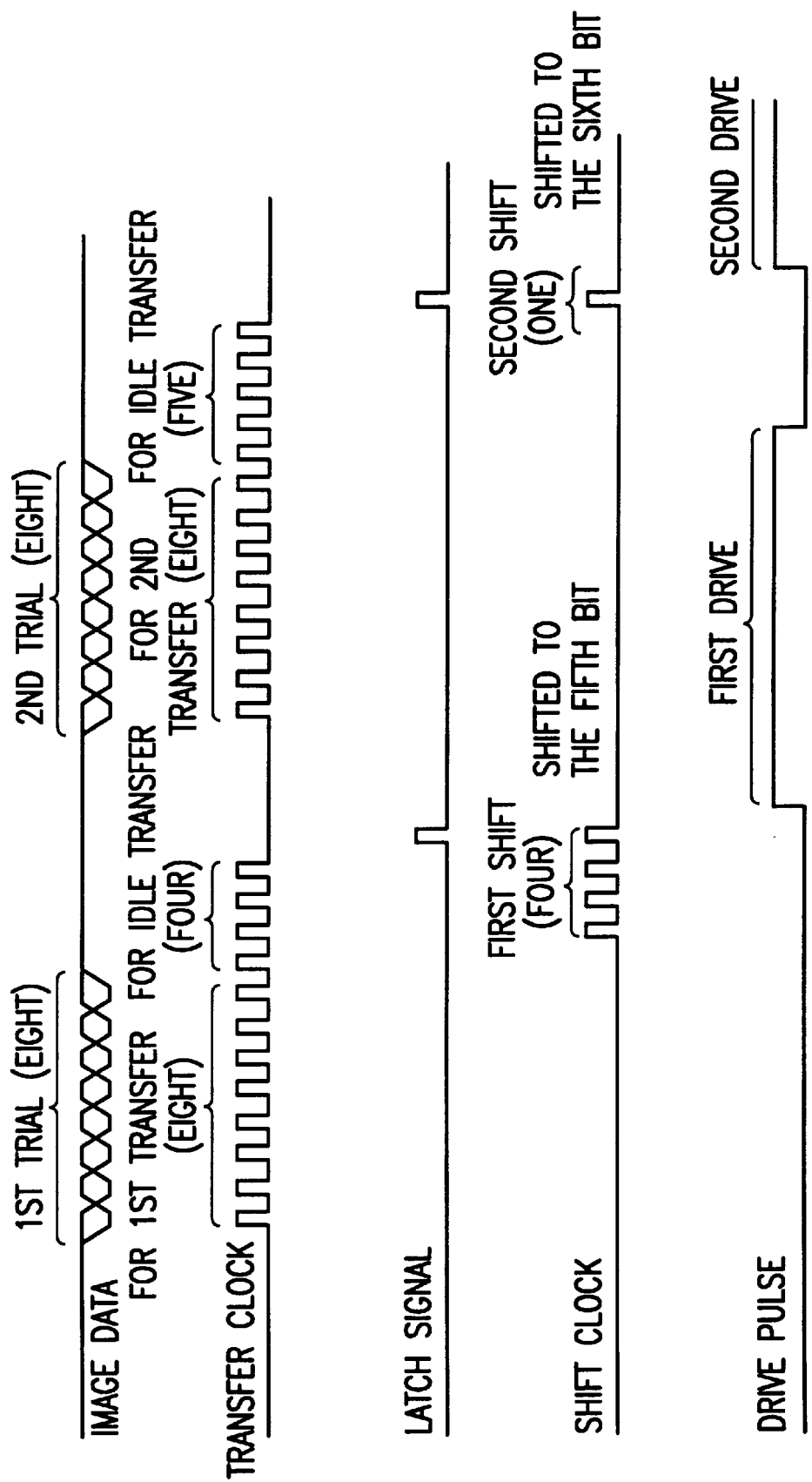
FIG. 24 is a diagram for explaining the operation of the driving circuit of FIG. 23.

The bit shift operation for selecting the anode wiring is independent of the operation of the cathode side driving circuit 25. Therefore, this bit shift operation is actually performed in occurrence with the operation of the cathode side driving circuit 25 and it is terminated when the latch signal is input to the latch circuit 27 as shown in FIG. 24 in order to shorten the driving time.

When the first drive pulse is supplied to the AND gate 23 of the anode side driving circuit 21 under this condition, the first drive pulse is impressed solely to the fifth anode wiring and only the lasers, among eight lasers connected to the fifth anode wiring, for which the low voltage V1 is applied to the cathode wiring emit light.

At the same time, eight image data to be used for the second drive is started to be inputted to the shift register 26 by the transfer clock in the cathode side driving circuit 25 without waiting for termination of the drive pulse.

In the second drive, since the sixth anode wiring is driven, the eight image data are inputted to the shift register 26 by means of eight transfer clock pulses and thereafter these data are further transferred for five bits into the shift register 26 by means of the five transfer clock pulses.

Upon completion of the second idle transfer and after the first drive pulse, the latch signal is supplied to the latch circuit 27. Thereby, eight image data are transferred in parallel to the latch circuit 27 from the sixth to 13th bits of the shift register 26 and the high or low voltage is impressed depending on the image data to the eight cathode wirings connected to the sixth anode wiring via the lasers to be driven.

Next, in the anode side driving circuit 21, one shift clock pulse is supplied to the ring shift register 22 to select the sixth anode wiring and the high level signal in the the ring shift from the fifth bit register 22 is shifted to the sixth bit.

When the second drive pulse is supplied to the AND gate 23 of the anode side driving circuit 21 under this condition, the second drive pulse is impressed solely to the sixth anode wiring and only the lasers, for which the low bias voltage V1 is impressed to the cathode wiring among eight laser elements connected to the sixth anode wiring emit light.

The operation explained above is sequentially repeated from the left side to the right side of the surface light emitting laser array 10 to complete one main scanning operation. Thereby, an exposed image depending on the image data, namely, an electrostatic latent image, is formed on the photosensitive material drum 40 by repeating such main scanning operation each time when the photosensitive material drum 40 of FIG. 16 rotates by a specified angle.

Although not illustrated in the image forming apparatus of FIG. 16, the electrostatic latent image formed on the photosensitive material drum 40 as explained above is then developed into a toner image by the developing unit, the toner image is then transferred on a recording paper by the transfer unit and the transferred toner image is fixed by the fixing unit and is provided as the final output image.

In the above example, the surface light emitting laser array 10 is driven in such a way that the light emission of each laser is ON-OFF controlled, but the surface light emitting laser array 10 can also be driven to vary the light emission intensity of each laser as explained in (Fifth driving method) of the [Method of driving two-dimensional surface light emitting laser array].

In the example of FIG. 16, the image forming apparatus forms an electrostatic latent image on the photosensitive material drum 40 and develops this electrostatic latent image into the toner image. However, the present invention can also be adopted to the image forming apparatus which uses, a photosensitive paper, for example, as the photosensitive material, on which a visible image can directly be formed by irradiation of the laser beam.

[Embodiment as the two-dimensional device array other than the two-dimensional surface light emitting laser array]

The oblique matrix wiring of the present invention may also be adopted to the two-dimensional device array where many active or passive devices such as light emitting devices and displaying devices, other than the semiconductor laser elements are arranged in two dimensions to realize light emission, display or positional detection within a constant surface, thereby similar effects are provided.

Figure 25:
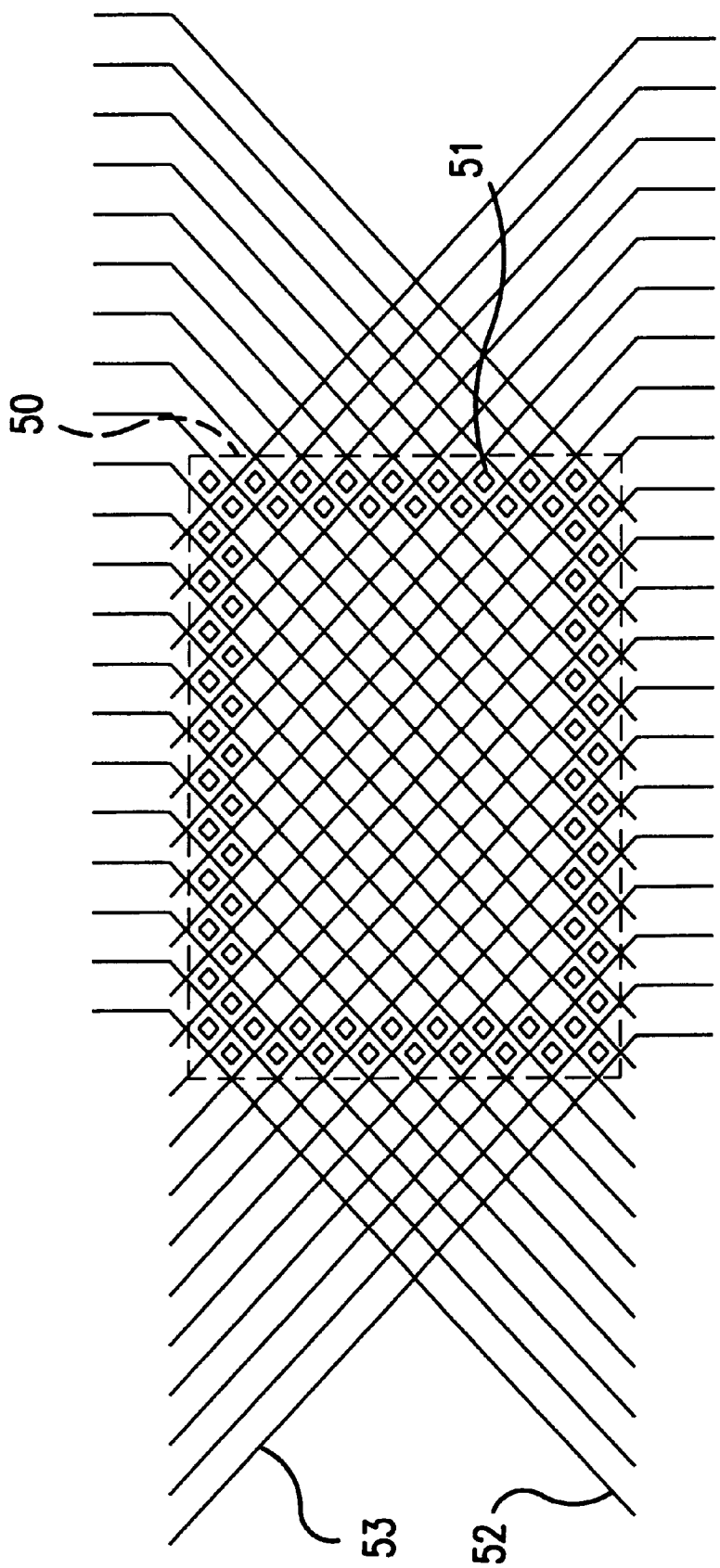
FIG. 25 is a diagram showing an example of the two-dimensional device array of the present invention.
Figure 26A:
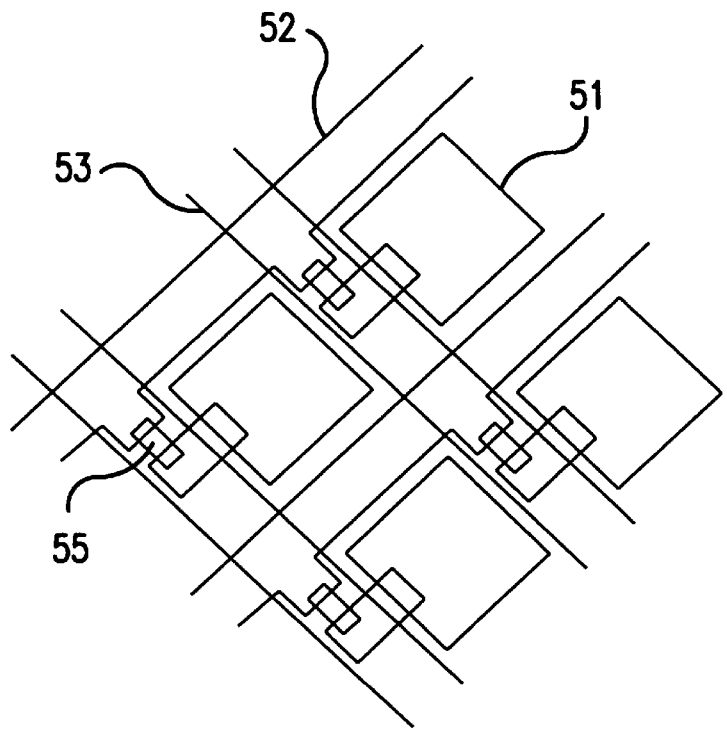
FIG. 26 is a diagram showing the essential portion of the two-dimensional device array of FIG. 25.
Figure 26B:
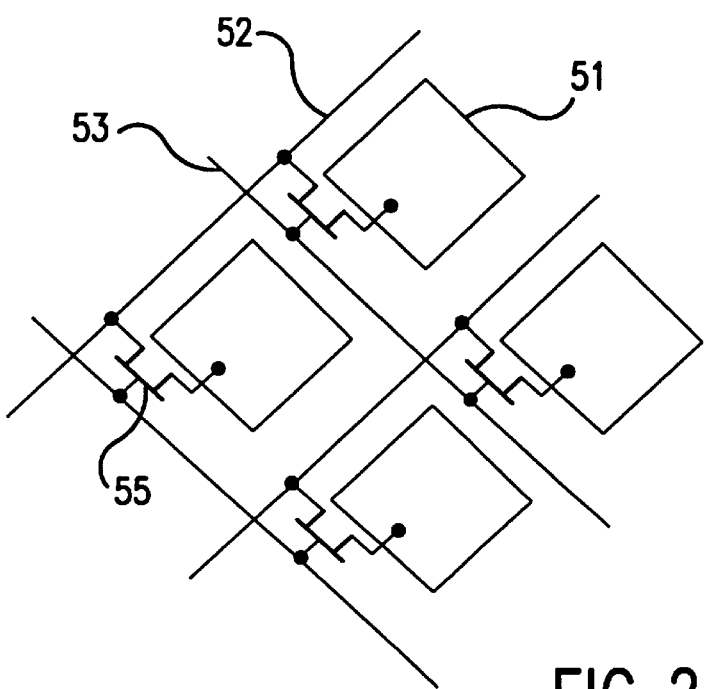

FIG. 25 and FIG. 26 show an example of the two-dimensional device array of the present invention in which the oblique matrix wiring of the present invention is adopted to a liquid crystal display apparatus of the active matrix driving system.

In this example, the pixel electrodes 51 are arranged in two dimensions, namely, n electrodes are provided in the horizontal direction, while m electrodes are provided in the vertical direction of the elongated rectangular display region 50 having the longer side in the horizontal direction, a common electrode which is not shown in the figure is formed in opposite to the pixel electrodes 51 and the liquid crystal not illustrated in the figure is provided between the pixel electrodes 51 and the common electrode.

Therein, n>m and the pixel electrodes 51 are formed, for example, in such a manner that the four sides of a square shape are inclined by 45 degrees to the longer side and shorter side directions of the display area 50.

Moreover, the first wiring 52 extending in the direction of 45 degrees to the longer and shorter side directions of the display region 50 are arranged in the longer side direction and the second wiring 53 crossing in orthogonally the first wiring 52 are arranged in the longer side direction. Moreover, the TFTs (thin film transistors) 55 are arranged in two dimensions corresponding to the pixel electrodes 51.

The source of a TFT 55 is connected to the electrode 51 of a pixel and drains thereof to the first wiring 52 and the gate thereof to the second wiring 53.

In this example, the "device" in the present invention is a TFT 55 and the "first electrode and second electrode" are the drain and gate of the TFT 55 respectively. However, the drain of the TFT 55 may be connected to the electrode 51 of a pixel source and the source may be connected to the first wiring 52. In this case, the "first electrode and second electrode" are the source and gate of the TFT 55.

The two-dimensional device array of this example is similar to the liquid crystal display apparatus of the known active matrix driving system, except for the point that the oblique matrix wiring is made for TFT 55.

Namely, in the two-dimensional device array of this example, a the predetermined voltage is impressed across the pixel electrode and common electrode at the intersecting point of the selected first writing 52 and the selected second wiring 53 and the pixels at the intersecting point is displayed.

Moreover, in this two-dimensional device array of this example, since the oblique matrix wiring is provided for TFT 55, the wiring resistance of the first and second wiring 52 and 53.

Namely, when the length of the longer side of the display region 50 is defined as W and the length of the shorter side as H, the length of the row wiring becomes W in the vertical and horizontal matrix wiring of the related art and the length of the row wiring becomes W/2 in the matrix wiring divided into four sections. Meanwhile, in the oblique matrix wiring of this example, since the first wiring 52 and second wiring 53 are inclined by 45 degrees from the longer side and shorter side directions of the display region 50, the lengths of the first wiring 52 and the second wiring 53 are equal to $2^{1/2}$ H (square root of 2 times of H).

Therefore, when the length W is equal to or larger than H×1.5, the first wiring 52 and second wiring 53 become shorter than the row wiring in the vertical and horizontal matrix wiring. Moreover, when the length W is equal to or larger than H×3, the first wiring 52 and second wiring 53 become shorter than the row wiring in the matrix wiring divided into four sections.

Because the wiring resistance is proportional to the length of the wiring, the wiring resistance of the first and second wiring 52 and 53 is smaller than those of the row wiring in the vertical and horizontal matrix wiring of the related art and of the row wiring in the four-section matrix wiring.

Moreover, in the two-dimensional device array of this example, the electrostatic capacitance of the first wiring 52 and second wiring 53 becomes small for the same reason. Therefore, according to the two-dimensional device array of this example, the operation delay of the device, unnecessary power consumption and crosstalk between the devices can be suppressed.

In addition to the liquid crystal display apparatus of the active matrix driving system, the present invention can also be adopted, in the same manner, to various kinds of two-dimensional displaying device arrays or two-dimensional light emitting device array such as a plasma display panel (PDP), LED panel and EL panel, and moreover to the two-dimensional device array of the devices such as active devices and passive devices, other than the displaying devices and light emitting devices.

As explained previously, according to the present invention, no matter how longer the long side of the region arranging the devices in two dimensions may be than the shorter side of the region and no matter how larger the number of devices n in the longer side direction may be to than the number of devices m in the shorter side direction, wiring resistance and electrostatic capacitance of the first wiring and the second wiring forming the oblique matrix wiring can remain small and thereby the operation delay of devices, unnecessary power consumption and crosstalk between devices can also be suppressed.

Moreover, since the range of wiring connected via one device is restricted, a plurality of devices located in the areas sufficiently a part with each other can be driven simultaneously and the array as a whole can be driven at a high speed.

In addition, since the electrical characteristic does not depend on the number of devices n in the longer side direction of the array, the array can be scaled up in the longer side one direction without deteriorating the characteristics.

Moreover, the two-dimensional surface light emitting laser array of the present invention can be used in various application fields as a light source such as printer, scanner and display.

What is claimed is:

1. A two-dimensional device array comprising:
   devices having at least first electrodes and second electrodes and arranged in two dimensions in an elongated region with n devices in a longer side direction of the elongated region and m devices in a shorter side direction of the elongated region (where m<n);
   first wirings of n or more in number, each of the first wirings being connected to said first electrodes of m elements in maximum arranged in a first direction crossing said longer side direction, stretching in said first direction and arranged in said longer side direction; and
   second wirings of n or more in number, each of the second wirings being connected to said second electrodes of m elements in maximum arranged in a second direction crossing said longer side direction and said first direction, stretching in said second direction and arranged in said longer side direction.

2. A two-dimensional device array according to claim 1, wherein said shorter side direction is perpendicular to said longer side direction and said first direction is parallel to said shorter side direction.

3. A two-dimensional device array according to claim 1, wherein said shorter side direction is perpendicular to said longer side direction and said first direction is inclined to said longer side direction.

4. A two-dimensional device array according to claim 1, wherein said shorter side direction is not perpendicular to said longer side direction and said first direction is parallel to said shorter side direction.

5. A two-dimensional device array according to claim 1, wherein said first wirings have contact pads on one side of said elongated region in said shorter side direction and said second wirings have contact pads on another side of said elongated region.

6. A two-dimensional device array according to claim 1, wherein said first wirings and said second wirings have contact pads on a same side of said elongated region in said shorter side direction.

7. A two-dimensional device array according to claim 1, wherein said first wirings and said second said wirings respectively have contact pads alternately on one side and another side of said elongated region in said shorter side direction in every other or every several other wirings.

8. A two-dimensional device array according to claim 1, wherein, said n or more first wirings and said n or more second wirings are formed on a common substrate.

9. A method for driving a two-dimensional device array comprising:
   devices having at least first electrodes and second electrodes and arranged in two dimensions in an elongated region with n devices in a longer side direction of the elongated region and m devices in a shorter side direction of the elongated region (where m<n);
   first wirings of n or more in number, each of the first wirings being connected to said first electrodes of m elements in maximum arranged in a first direction crossing said longer side direction, stretching in said first direction and arranged in said longer side direction; and
   second wirings of n or more in number, each of the second wirings being connected to said second electrodes of m elements in maximum arranged in a second direction crossing said longer side direction and said first direction, stretching in said second direction and arranged in said longer side direction,
   wherein said method comprises:
      impressing a drive voltage to one of said first wirings;
      simultaneously impressing a bias voltage to (m−1) of said first wirings on both sides of said one first wiring; and
      sequentially or simultaneously impressing a voltage to m of said second wirings which are crossing said one first wiring and connected to said second electrodes of m devices on said one first wiring, resulting in a voltage difference which is above a threshold voltage for operating said devices across said m devices connected to said one first wiring, and resulting in another voltage difference which is below the threshold voltage across the devices connected to (m−1) of said first wirings on both sides of said one first wiring.

10. A method for driving a two-dimensional device array comprising:
   devices having at least first electrodes and second electrodes and arranged in two dimensions in an elongated region with n devices in a longer side direction of the elongated region and m devices in a shorter side direction of the elongated region (where m<n);
   first wirings of n or more in number, each of the first wirings being connected to said first electrodes of m elements in maximum arranged in a first direction crossing said longer side direction, stretching in said first direction and arranged in said longer side direction; and
   second wirings of n or more in number, each of the second wirings being connected to said second electrodes of m elements in maximum arranged in a second direction crossing said longer side direction and said first direction, stretching in said second direction and arranged in said longer side direction, wherein said method comprises:
simultaneously driving n/m or less of said first wirings separated by (m−1) or more wirings between each other; and
simultaneously impressing a bias voltage to an undriven remainder of said first wirings.

11. A two-dimensional surface light emitting laser array comprising:
surface light emitting laser elements having at least first electrodes and second electrodes and arranged in two dimensions in an elongated rectangular region on a semiconductor substrate, with n laser elements in a longer side direction of the elongated rectangular region and m laser elements in a shorter side direction of the elongated rectangular region (where m<n);
first wirings of n or more in number, each of the first wirings being connected to said first electrodes of m elements in maximum arranged in a first direction crossing said longer side direction, stretching in said first direction and arranged in said longer side direction; and
second wirings of n or more in number, each of the second wirings being connected to said second electrodes of m elements in maximum arranged in a second direction crossing said longer side direction and said first direction, stretching in said second direction and arranged in said longer side direction.

12. A two-dimensional surface light emitting laser array according to claim 11, wherein said shorter side direction is perpendicular to said longer side direction and said first direction is parallel to said shorter side direction.

13. A two-dimensional surface light emitting laser array according to claim 11, wherein said shorter side direction is perpendicular to said longer side direction and said first direction is inclined to said longer side direction.

14. A two-dimensional surface light emitting laser array according to claim 11, wherein said shorter side direction is not perpendicular to said longer side direction and said first direction is parallel to said shorter side direction.

15. A two-dimensional surface light emitting laser array according to claim 11, wherein said first wirings have contact pads on one side of said elongated region in said shorter side direction and said second wirings have contact pads on another side of said elongated region.

16. A two-dimensional surface light emitting laser array according to claim 11, wherein said first wirings and said second wirings have contact pads on the same side of said elongated region in said shorter side direction.

17. A two-dimensional surface light emitting laser array according to claim 11, wherein said first wirings and said second wirings respectively have contact pads alternately on one side and another side of said elongated region in said shorter side direction in every other or every several other wirings.

18. A method for driving a two-dimensional surface light emitting laser array comprising:
surface light emitting laser elements having at least first electrodes and second electrodes and arranged in two dimensions in an elongated rectangular region on a semiconductor substrate, with n laser elements in a longer side direction and of the elongated rectangular region m laser elements in a shorter side direction of the elongated rectangular region (where m<n);
first wirings of n or more in number, each of the first wirings being connected to said first electrodes of m elements in maximum arranged in a first direction crossing said longer side direction, stretching in said first direction and arranged in said longer side direction; and
second wirings of n or more in number, each of the second wirings being connected to said second electrodes of m elements in maximum arranged in a second direction crossing said longer side direction and first direction, stretching in said second direction and arranged in said longer side direction, wherein said method comprises:
impressing a drive voltage to one of said first wirings;
simultaneously impressing a bias voltage to (m−1) of said first wirings on both sides of said one first wiring; and
sequentially or simultaneously impressing a voltage to m of said second wirings which are crossing said one first wiring and connected to said second electrodes of m lasers on said one first wiring, resulting in a voltage difference which is above a threshold voltage for operating said lasers across said m lasers connected to said one first wiring, and resulting in another voltage difference which is below the threshold voltage across the lasers connected to (m−1) of said first wirings on both sides of said one first wiring.

19. A method for driving a two-dimensional surface light emitting laser array comprising:
surface light emitting laser elements having at least first electrodes and second electrodes and arranged in two dimensions in an elongated rectangular region on a semiconductor substrate, with n laser elements in a longer side direction of the elongated rectangular region and m laser elements in a shorter side direction of the elongated rectangular region (where m<n);
first wirings of n or more in number, each of the first wirings being connected to said first electrodes of m elements in maximum arranged in a first direction crossing said longer side direction, stretching in said first direction and arranged in said longer side direction; and
second wirings of n or more in number, each of the second wirings being connected to said second electrodes of m laser elements in maximum arranged in a second direction crossing said longer side direction and first direction, stretching in said second direction and arranged in said longer side direction, wherein said method comprises:
simultaneously driving n/m or less of said first wirings separated by (m−1) or more wirings between each other; and
simultaneously impressing a bias voltage to an undriven remainder of said first wirings.

20. An image forming apparatus comprising:
a two-dimensional surface light emitting laser array;
a driving circuit for driving said two-dimensional surface light emitting laser array in a predetermined scanning pattern; and
an optical system for irradiating a photosensitive material with laser beams from said two-dimensional surface light emitting laser array,
wherein said two-dimensional surface light emitting laser array comprises:

surface light emitting laser elements having at least first electrodes and second electrodes and arranged in two dimensions in an elongated rectangular region on a semiconductor substrate, with n laser elements in a longer side direction of the elongated rectangular region and m laser elements in a shorter side direction of the elongated rectangular region (where m<n);

first wirings of n or more in number, each of the first wirings being connected to said first electrodes of m elements in maximum arranged in a first direction crossing said longer side direction, stretching in said first direction and arranged in said longer side direction; and second wirings of n or more in number, each of the second wirings being connected to said second electrodes of m laser elements in maximum arranged in a second direction crossing said longer side direction and said first direction, stretching in said second direction and arranged in said longer side direction.

21. An image forming apparatus according to claim 20, wherein said photosensitive material forms an electrostatic latent image by irradiation of the laser beams from said two-dimensional surface light emitting laser array via said optical system.

* * * * *